(12) United States Patent
Gan et al.

(10) Patent No.: US 9,024,398 B2
(45) Date of Patent: May 5, 2015

(54) PERPENDICULAR STTMRAM DEVICE WITH BALANCED REFERENCE LAYER

(71) Applicant: Avalanche Technology Inc., Fremont, CA (US)

(72) Inventors: Huadong Gan, Fremont, CA (US); Yuchen Zhou, San Jose, CA (US); Yiming Huai, Pleasanton, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 14/026,163

(22) Filed: Sep. 13, 2013

(65) Prior Publication Data

US 2014/0015076 A1   Jan. 16, 2014

Related U.S. Application Data

(63) Continuation-in-part of application No. 13/029,054, filed on Feb. 16, 2011, now Pat. No. 8,598,576, and a continuation-in-part of application No. 13/277,187, filed on Oct. 19, 2011, now abandoned, and a continuation-in-part of application No. 12/965,733, filed on Dec. 10, 2010, now Pat. No. 8,623,452.

(60) Provisional application No. 61/483,314, filed on May 6, 2011.

(51) Int. Cl.
| | |
|---|---|
| *H01L 29/82* | (2006.01) |
| *H01F 10/32* | (2006.01) |
| *G11C 11/16* | (2006.01) |
| *H01F 41/30* | (2006.01) |
| *H01L 29/66* | (2006.01) |
| *H01L 43/08* | (2006.01) |
| *B82Y 40/00* | (2011.01) |

(52) U.S. Cl.
CPC ............ *H01L 29/82* (2013.01); *H01F 10/3286* (2013.01); *G11C 11/161* (2013.01); *H01F 41/302* (2013.01); *H01L 29/66984* (2013.01); *H01L 43/08* (2013.01); *H01F 10/329* (2013.01); *B82Y 40/00* (2013.01); *H01F 10/3295* (2013.01)

(58) Field of Classification Search
CPC . H01F 10/3286; H01F 41/302; H01F 10/329; G11C 11/161; H01L 29/66984; H01L 43/08; H01L 29/82
USPC ........................................................ 257/421
See application file for complete search history.

(56) References Cited

U.S. PATENT DOCUMENTS

2003/0200927 A1   10/2003   Watanabe et al.
2006/0098354 A1   5/2006    Parkin
(Continued)

OTHER PUBLICATIONS

W. H. Butler, X. G. Zhang, S. Vutukuri, M. Chshiev and T. C. Schulthess, "Theory of Tunneling Magnetoresistance for Epitaxial Systems," IEEE Transactions on Magnetics, pp. 2645-2648, vol. 41, No. 10, Oct. 2005.

*Primary Examiner* — Walter H Swanson
(74) *Attorney, Agent, or Firm* — Bing K. Yen

(57) ABSTRACT

A spin transfer torque magnetic random access memory (STTMRAM) element comprises a reference layer, which can be a single layer structure or a synthetic multi-layer structure, formed on a substrate, with a fixed perpendicular magnetic component. A junction layer is formed on top of the reference layer and a free layer is formed on top of the junction layer with a perpendicular magnetic orientation, at substantially its center of the free layer and switchable. A tuning layer is formed on top of the free layer and a fixed layer is formed on top of the tuning layer, the fixed layer has a fixed perpendicular magnetic component opposite to that of the reference layer. The magnetic orientation of the free layer switches relative to that of the reference layer. The perpendicular magnetic components of the fixed layer and the reference layer substantially cancel each other and the free layer has an in-plane edge magnetization field.

63 Claims, 20 Drawing Sheets

(56) References Cited

U.S. PATENT DOCUMENTS

| | | |
|---|---|---|
| 2008/0180991 A1* | 7/2008 | Wang .......................... 365/171 |
| 2008/0191295 A1* | 8/2008 | Ranjan et al. ................ 257/421 |
| 2010/0118600 A1* | 5/2010 | Nagase et al. ............... 365/158 |
| 2010/0230770 A1 | 9/2010 | Yoshikawa et al. |
| 2011/0096443 A1* | 4/2011 | Zhang et al. ............... 360/324.2 |
| 2011/0170341 A1* | 7/2011 | Butler ......................... 365/171 |
| 2011/0171493 A1* | 7/2011 | Worledge et al. ........... 428/800 |
| 2011/0227179 A1* | 9/2011 | Kitagawa et al. ............ 257/421 |
| 2012/0134201 A1* | 5/2012 | Ogimoto ...................... 365/158 |

\* cited by examiner

PERPENDICULAR STTMRAM DEVICE WITH BALANCED REFERENCE LAYER

CROSS REFERENCE TO RELATED APPLICATIONS

This application is a continuation-in-part of the commonly assigned application bearing Ser. No. 13/029,054 filed on Feb. 16, 2011 by Zhou et al. and entitled "Magnetic Random Access Memory With Field Compensating Layer and Multi-Level Cell," and a continuation-in-part of the commonly assigned application bearing Ser. No. 13/277,187 filed on Oct. 19, 2011 by Huai et al., and entitled "Memory System Having Thermally Stable Perpendicular Magneto Tunnel Junction (MTJ) and A Method of Manufacturing Same," which claims priority to U.S. Provisional Application No. 61/483,314. The present application is related to the commonly assigned copending application bearing Ser. No. 13/737,897 filed on Jan. 9, 2013, the commonly assigned copending application bearing Ser. No. 14/021,917 filed on Sep. 9, 2013, the commonly assigned copending application bearing Ser. No. 13/099,321 filed on May 2, 2011, and the commonly assigned copending application bearing Ser. No. 13/928,263.

BACKGROUND OF THE INVENTION

1. Field of the Invention

The present invention relates generally to magnetic memory elements having magnetic tunnel junctions (MTJ) and particularly to improving the ease of switching of the free layer of the MTJ to reduce the requisite voltage and current for causing the free layer to switch magnetic states.

2. Description of the Prior Art

Magnetic random access memory (MRAM) is rapidly gaining popularity as its use in replacing conventional memory is showing promise. Magnetic tunnel junctions (MTJs), which are essentially the part of the MRAM that store information, include various layers that determine the magnetic behavior of the device. An exemplary MTJ uses spin transfer torque to effectuate a change in the direction of magnetization of one or more free layers in the MTJ. That is, writing bits of information is achieved by using a spin polarized current flowing through the MTJ, instead of using a magnetic field, to change states or program/write/erase/read bits.

In spin transfer torque (STT) MTJ designs, when electrons flow across the MTJ stack in a direction that is perpendicular to the film plane or from the pinned (sometimes referred to as "reference" or "fixed") layer to the free (or storage) layer, spin torque from electrons transmitted from the pinned layer to the free layer orientates the free layer magnetization in a direction that is parallel to that of the reference or pinned layer. When electrons flow from the free layer to the pinned layer, spin torque from electrons that are reflected from the pinned layer back into the free layer orientates the free layer magnetization to be anti-parallel relative to the magnetization of the pinned layer. Thus, controlling the electron (current) flow direction, direction of magnetization of the free layer magnetization is switched. Resistance across the MTJ stack changes between low and high states when the free layer magnetization is parallel or anti-parallel relative to that of the pinned layer.

However, a problem that is consistently experienced and that prevents advancement of the use of MTJs is the threshold voltage or current used to switch the free layer magnetization during a write. Such current and threshold voltage requirements are currently too high to allow practical applications of the spin transfer torque based MTJ.

MTJs with perpendicular anisotropy, such that the magnetic moments of the free layer and the fixed layer thereof are in perpendicular directions relative to the planes of the films, are more appealing than their in-plane anisotropy counterparts largely due to the density improvements realized by the former. Existing perpendicular MTJ designs include a free layer whose magnetic orientation relative to a reference ("fixed") layer, while perpendicular in direction, high coercivity field (Hc) of the free layer, at its edges, limits the reduction of the effective Hc of the free layer. Lower effective Hc of the free layer would allow easier switching of the free layer and would lower the threshold voltage and current required to switch the magnetization of the free layer.

It is noted that the foregoing problem occurs due to the inconsistent Hc throughout the free layer, as shown and discussed by way of a graph shortly. That is, perpendicular anisotropic field (Hk) of the free layer changes relative to the position within the free layer such that the center of the free layer generally has a lower Hc than the outer edges of the free layer with Hc essentially increasing from the center of the free layer to its outer edges. Accordingly, efforts to lower the perpendicular anisotropic field (Hk) of the free layer in order to ease switching result in lowering of effective Hc, undesirably increase the edge-to-center effective coercivity (Hc) ratio. The relationship between Hk and Hc is as follows:

$$Hc = Hk - Hdemag \qquad \text{Eq. (1)}$$

where Hdemag is the demagnetization field related to the magnetic moment, thickness, shape and size of the magnetic thin film.

For a greater understanding of the foregoing problem, FIGS. 1-3 show a relevant portion of a prior art magnetic memory element and a graph of its effective coercivity field performance.

FIG. 1 shows the relevant portion of a prior art magnetic random access memory (MRAM) element 10, which includes a reference layer 3, also known as a fixed layer, a barrier layer 2, also known as a tunnel layer, and a free layer 1. This configuration is common and very well known in the art. The layers 1-3 are often times collectively referred to as a magneto-tunnel junction (MTJ). When an electron current is applied through the layer 3 towards layer 1, for example during a write operation, the MRAM element 10 switches states where the magnetic moment of the layer 1 changes direction relative to the magnetic moment of the layer 3, from a direction shown by the arrow 5 to a direction shown by the arrow 6. Such a change in the layer 1 is also known as a change from an anti-parallel state, where the direction of the magnetic moment of the layer 1 is opposed to that of the layer 3 to a parallel state, where the direction of the magnetic moment of the layer 1 is same as that of the layer 3. The resistance of the MRAM element 10 changes according to its state and typically, such resistance is higher when the MRAM is in an anti-parallel state than when it is in a parallel state.

Lowering the perpendicular Hk of the layer 1 would make switching of the state of the MRAM 10 easier, however, as earlier noted, the effective Hc reduction, which would significantly ease switching of the state of the element 10 is limited because of the high Hc present at the edges of the layer 1. This is better noticed by the figures to follow.

FIG. 2 shows generally a top view 7 of the layer 1 of FIG. 2 and a side view 8 of the layer 1 of FIG. 2. The layer 1 is shown to be 65 nano meters in diameter, by way of example, and 1.2 nano meters in thickness. In accordance with these measurements, the effective Hc, in kilo Oersteds, vs. the position along the diameter of the layer 1, in nano meters (nm), is shown in a graph in FIG. 3. Accordingly, FIG. 3 shows a graph of the effective Hc, represented by the y-axis, vs. the position along the diameter of the layer 1, represented by the x-axis, for the case where the perpendicular Hk (p-Hk) is equal to 14.5 kilo Oersteds (kOe), shown by a line 10 and for the case where the perpendicular Hk of the layer 1 is equal to 13 kOe, shown by a line 11. As shown, the effective Hc increases going from the center of the layer 1 out to its edge and this change gradually increases at the far edge of the layer 1. When decreasing the perpendicular Hk from 14.5 kOe to 13 kOe, the edge-to-center effective Hc ratio is undesirably increased from 1.6 to 3.0.

Thus, the need arises for decreasing the perpendicular anisotropic field of the free layer of an MRAM yet avoiding a substantial increase in the effective Hc of the MRAM in order to reduce the threshold voltage and current required to operate the MRAM.

SUMMARY OF THE INVENTION

Briefly, a spin transfer torque magnetic random access memory (STTMRAM) element is disclosed for storing a state when electrical current is applied to it. The STTMRAM element includes a reference layer, formed on a substrate, having a perpendicular magnetic component associated therewith that is fixed in one direction. A junction layer is formed on top of the reference layer and a free layer is formed on top of the junction layer and has a magnetic orientation, at substantially the center of it that is perpendicular relative to the substrate and parallel and switchable relative to the reference layer. Further, a spacer layer is formed on top of the free layer and a fixed layer is formed on top of the spacer layer, the fixed layer having a perpendicular magnetic component associated therewith that is fixed in a direction opposite to that of the reference layer. The free layer is capable of switching its magnetic orientation relative to the fixed layer when electrical current is applied to the STTMRAM element. The perpendicular magnetic components of the fixed layer and the reference layer substantially cancel each other and the free layer has a magnetization field at its edge that is in-plane relative to the substrate.

According to another aspect of the present invention, an STTMRAM element includes a magnetic pinned layer having a first fixed magnetization direction substantially perpendicular to the film plane thereof, a magnetic free layer separated from the magnetic pinned layer by a non-magnetic tuning layer and having a variable magnetization direction substantially perpendicular to the film plane thereof, and a magnetic reference layer separated from the magnetic free layer by an insulating tunnel junction layer and having a second fixed magnetization direction substantially opposite to the first fixed magnetization direction of the magnetic pinned layer. The magnetic pinned layer and the magnetic reference layer have different magnetic switching fields and are formed on opposite sides of the magnetic free layer. The tuning layer has a thickness that allows the offset field in the magnetic free layer as exerted by the magnetic pinned layer and the magnetic reference layer to be about zero. The magnetic reference layer may further comprise a first and second magnetic reference layers interposed by a coupling layer therebetween.

These and other objects and advantages of the present invention will no doubt become apparent to those skilled in the art after having read the following detailed description of the various embodiments illustrated in the several figures of the drawing.

IN THE DRAWINGS

FIG. 1 shows the relevant portion of a prior art magnetic random access memory (MRAM) element 10, which includes a reference layer 3, also known as a fixed layer, a barrier layer 2, also known as a tunnel layer, and a free layer 1.

FIG. 2 shows generally a top view 7 of the layer 1 of FIG. 2 and a side view 8 of the layer 1 of FIG. 2.

FIG. 3 shows a graph of the effective Hc, represented by the y-axis, vs. the position along the diameter of the layer 1, represented by the x-axis, for the case where the perpendicular Hk (p-Hk) is equal to 14.5 kilo Oersteds (kOe), shown by a line 10 and for the case where the perpendicular Hk of the layer 1 is equal to 13 kOe, shown by a line 11.

FIG. 4 shows the relevant portion of a spin transfer torque magnetic random access memory (STTMRAM) element 30, in accordance with an embodiment of the present invention.

FIG. 5 shows a top view 35 of the layer 21 and a side view 37 of the layer 21, in accordance with an embodiment of the present invention.

FIG. 6 shows the relevant magnetization fields of the layers 23, 22, 21, 24 and 25 of the element 30, in accordance with an embodiment of the present invention.

Figure 9:
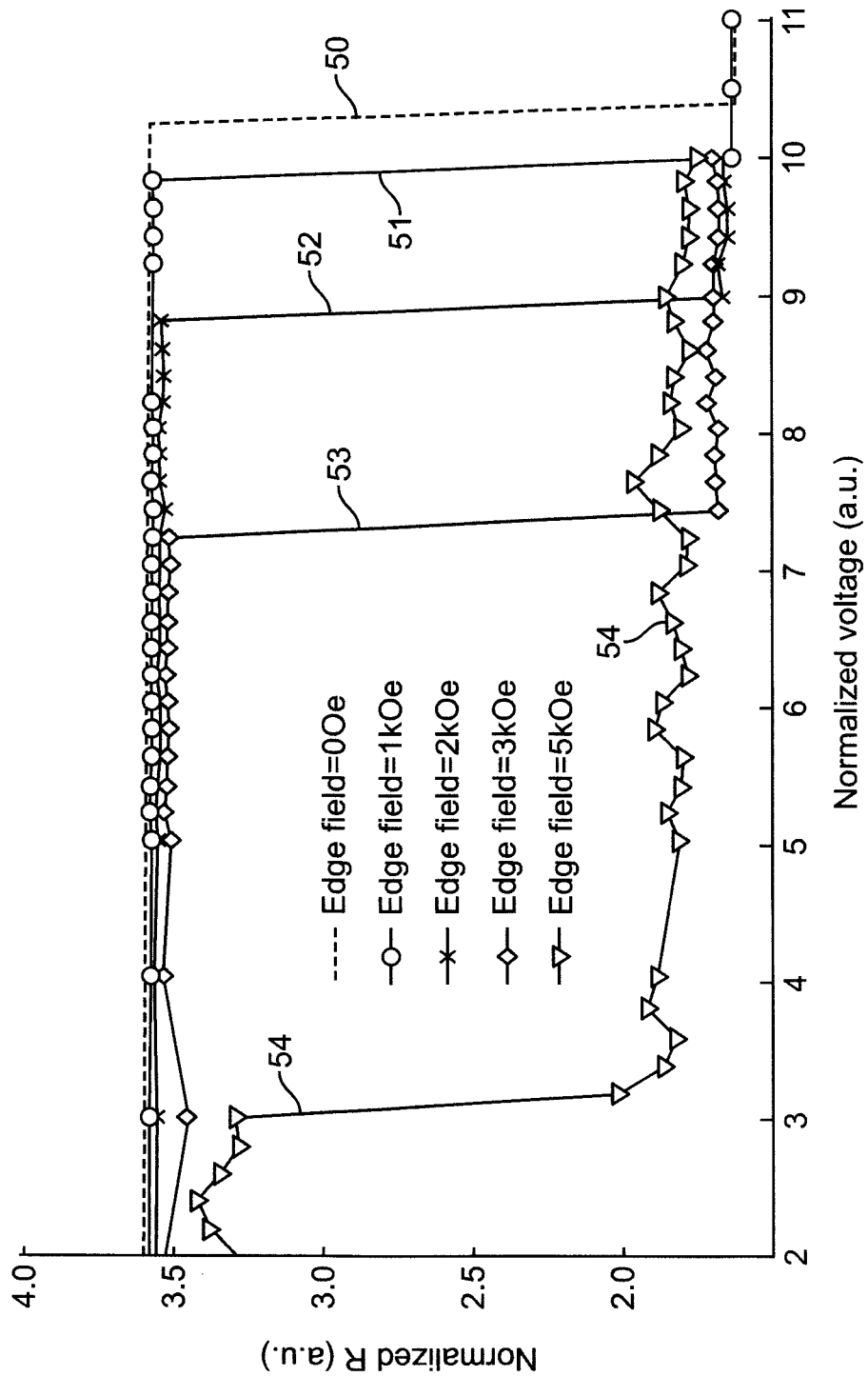

FIG. 9 shows a graph of the performance of the element 30 when various levels of edge fields, including none, are applied to the layer 21 of the element 30.

Figure 10:
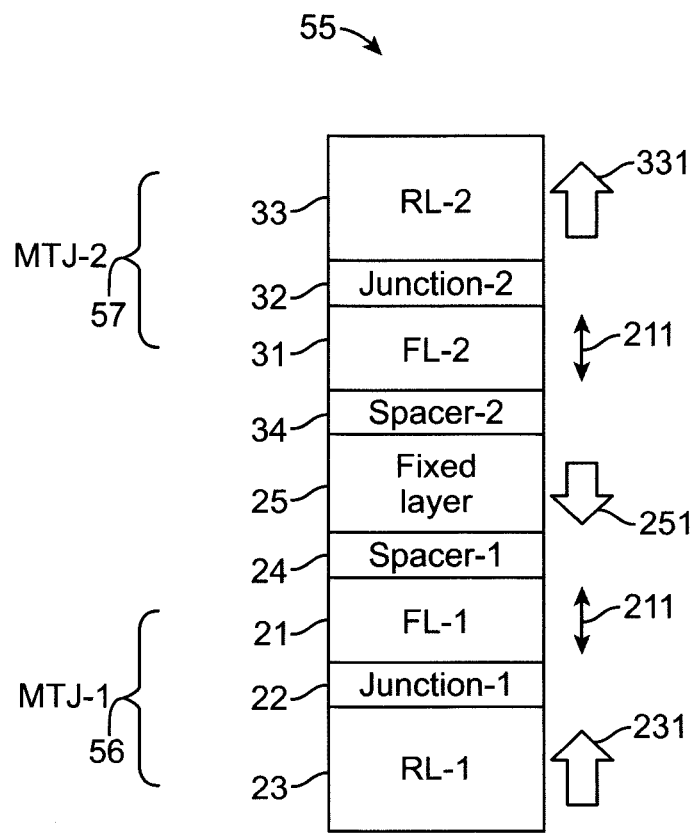

FIG. 10 shows the relevant portion of a spin transfer torque magnetic random access memory (STTMRAM) stack 55, in accordance with an embodiment of the present invention.

Figure 11:
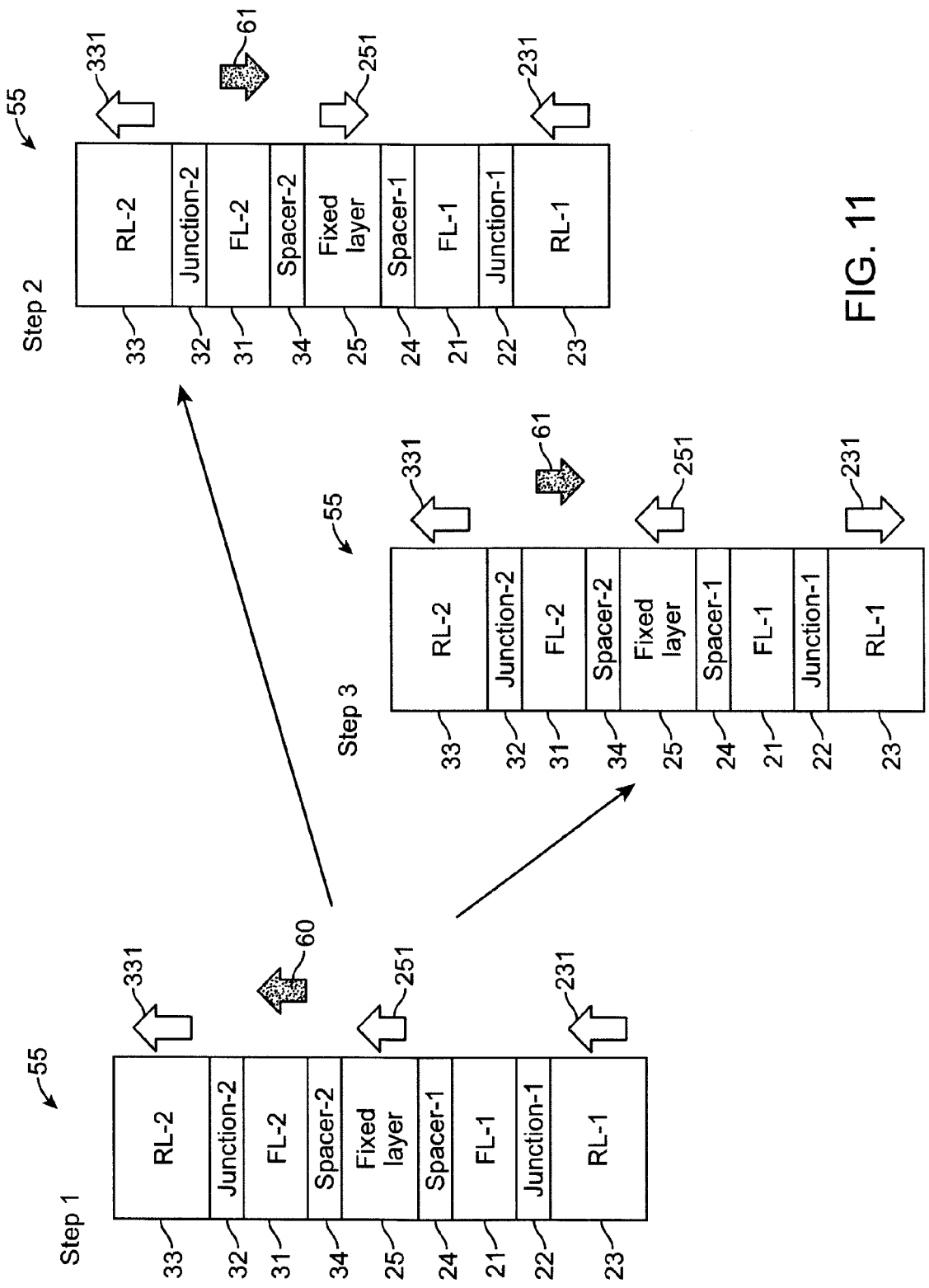

FIG. 11 shows the formation of the stack 55, in relevant part and accordance with a method of the present invention, as two steps.

Figure 12:
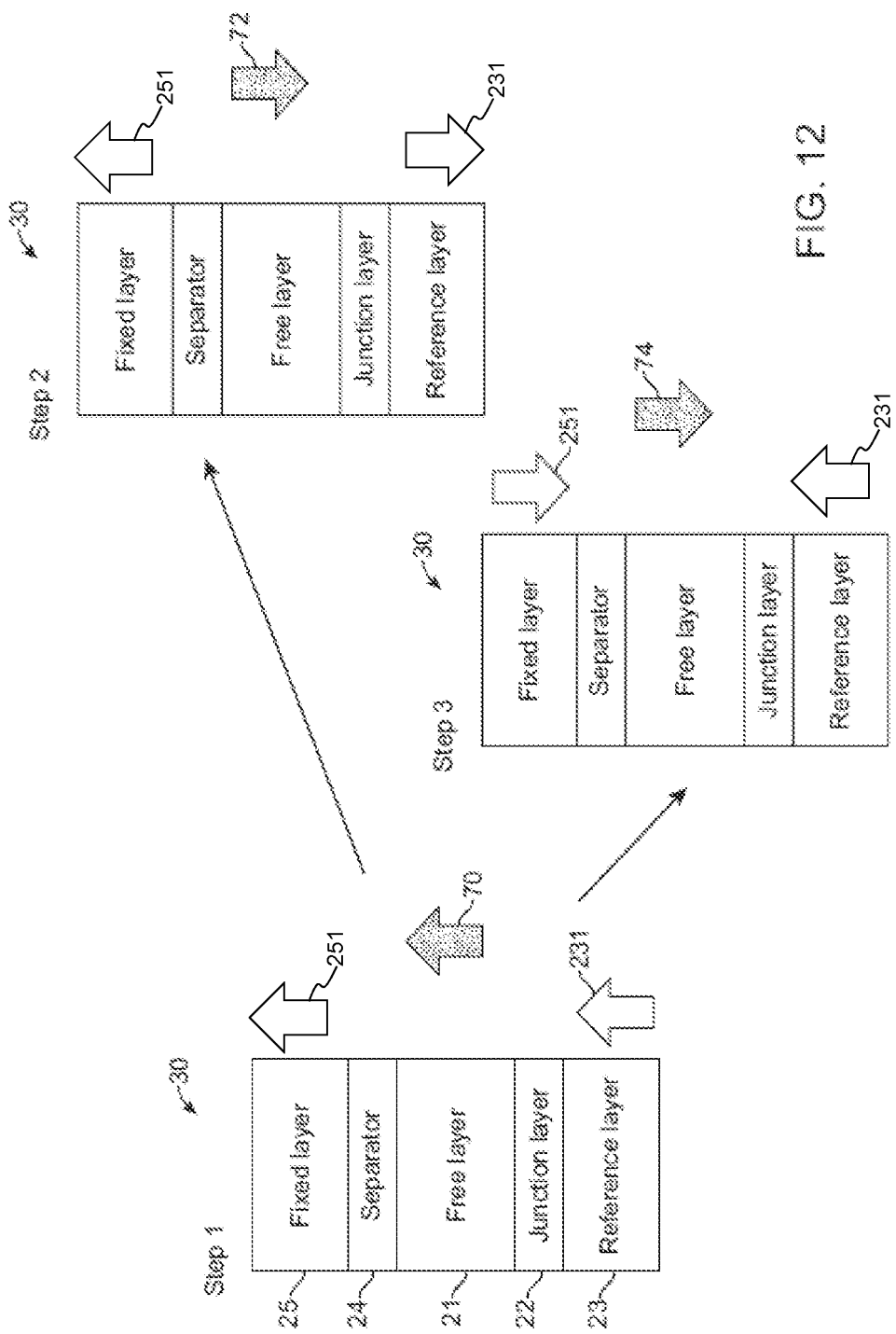

FIG. 12 shows the formation of the stack 30, in relevant part and accordance with another method of the present invention, as two steps.

Figure 13:
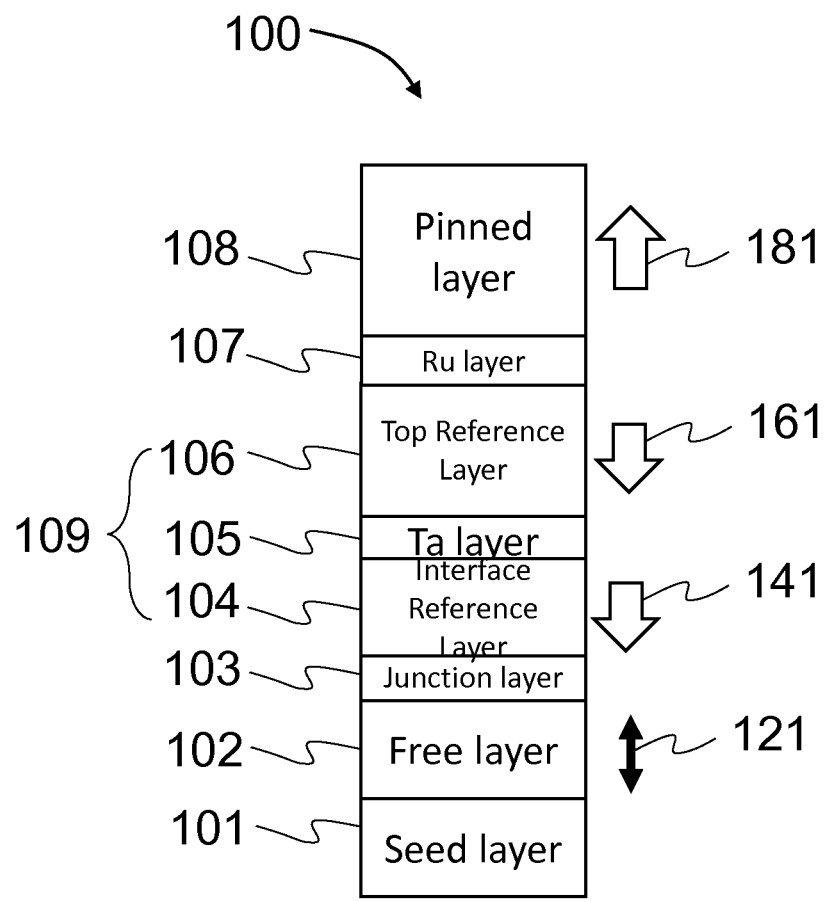

FIG. 13 shows an STTMRAM element according to an embodiment of the present invention.

Figure 14:
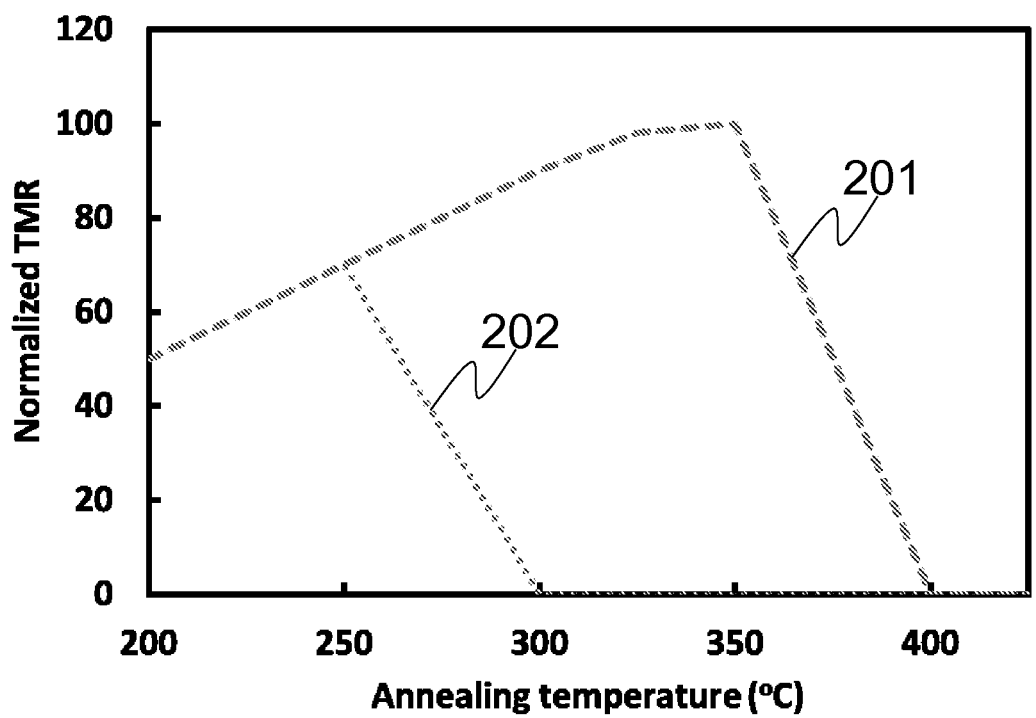

FIG. 14 shows TMR dependence curves on annealing temperature for STTMRAM elements 10 and 100.

Figure 15:
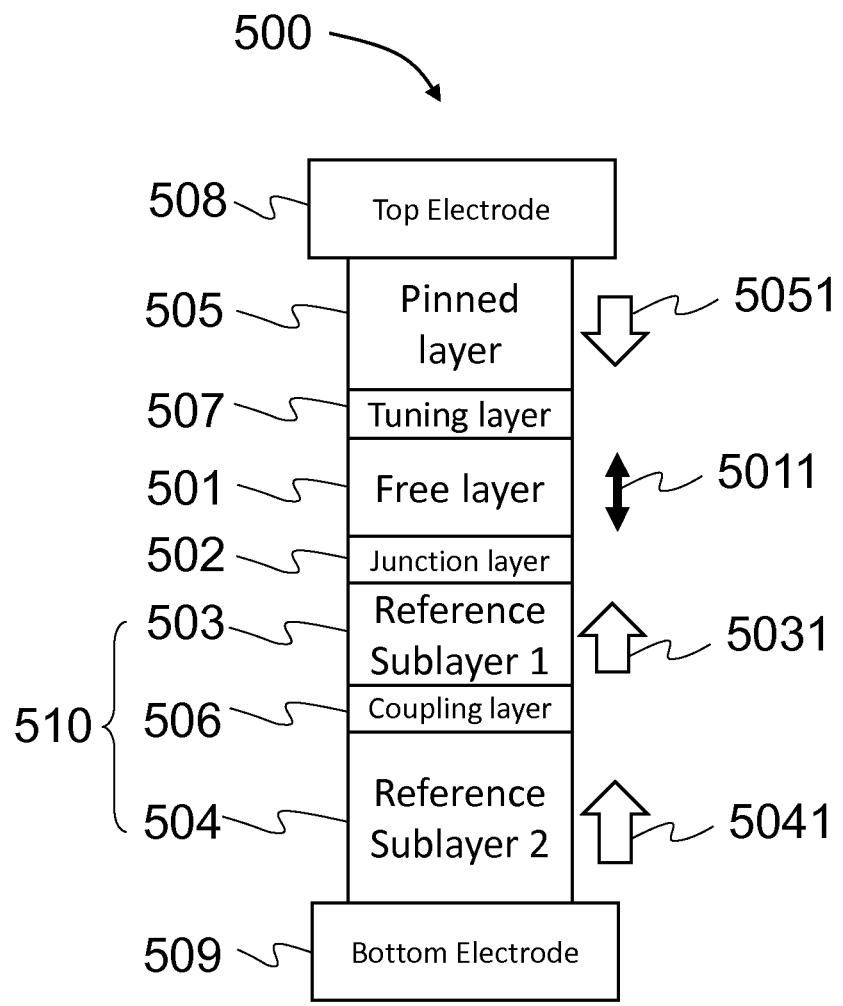

FIG. 15 shows an STTMRAM element according to another embodiment of the present invention.

Figure 16A:
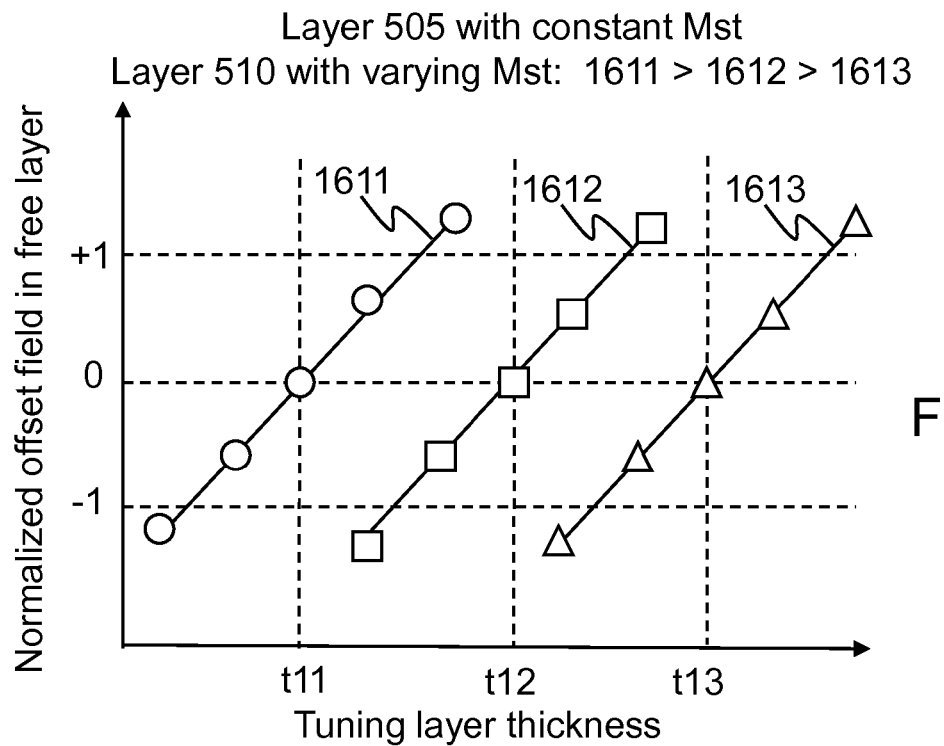

FIG. 16A shows dependence of offset field in the free layer on the tuning layer thickness for various pinning layer magnetic moment and thickness product of the STTMRAM element 500, in accordance with an embodiment of the present invention.

Figure 16B:
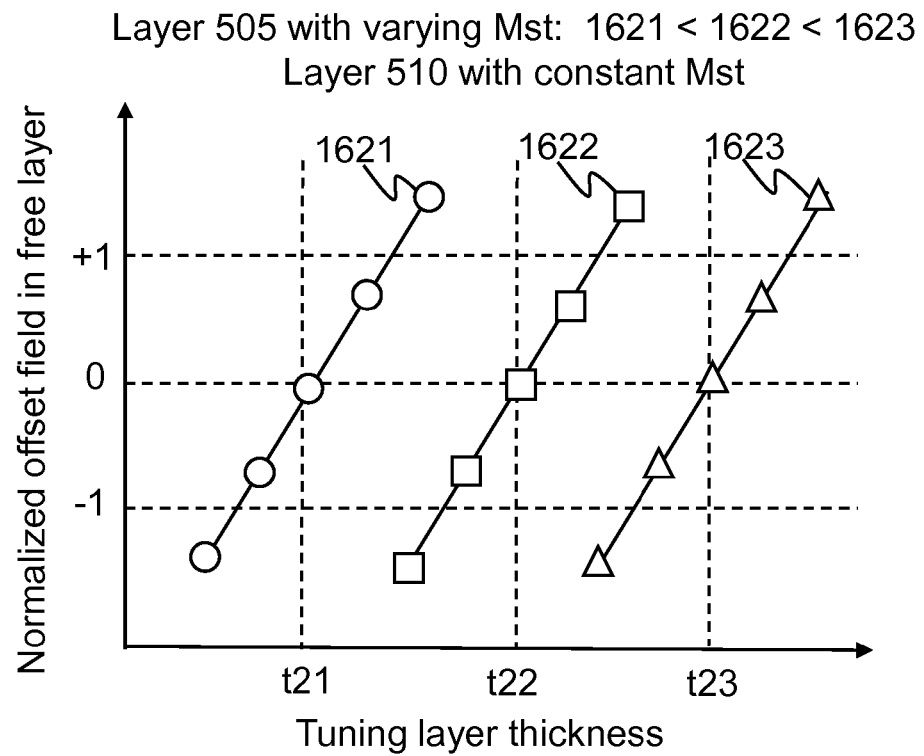

FIG. 16B shows dependence of offset field in the free layer on the tuning layer thickness for various reference layer magnetic moment and thickness product of the STTMRAM element 500, in accordance with another embodiment of the present invention.

Figure 17:
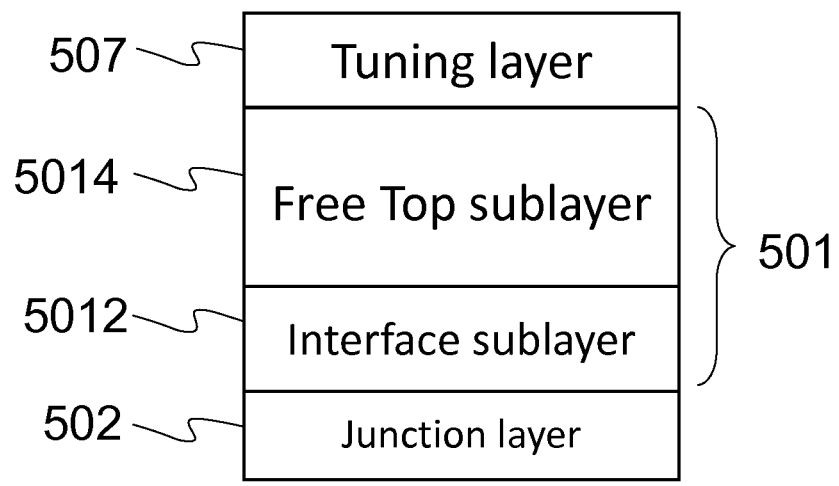

FIG. 17 shows the free layer portion of an STTMRAM element 500 in accordance with an embodiment of the present invention.

Figure 18:
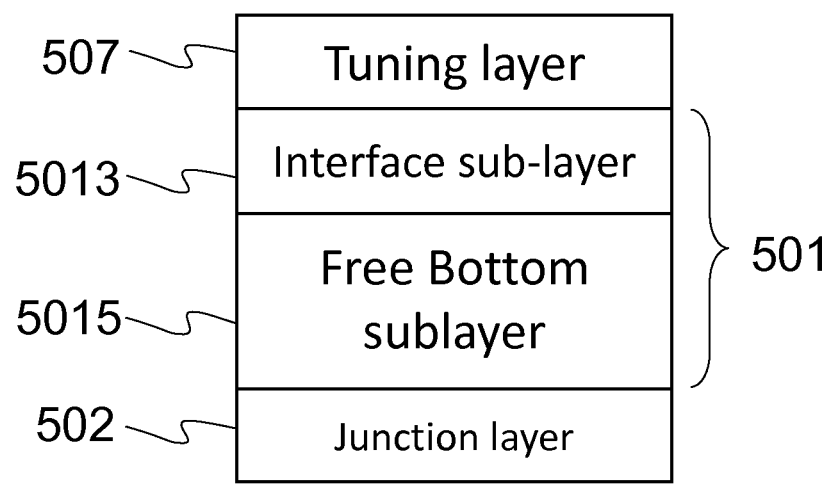

FIG. 18 shows the free layer portion of an STTMRAM element 500 in accordance with another embodiment of the present invention.

Figure 19:
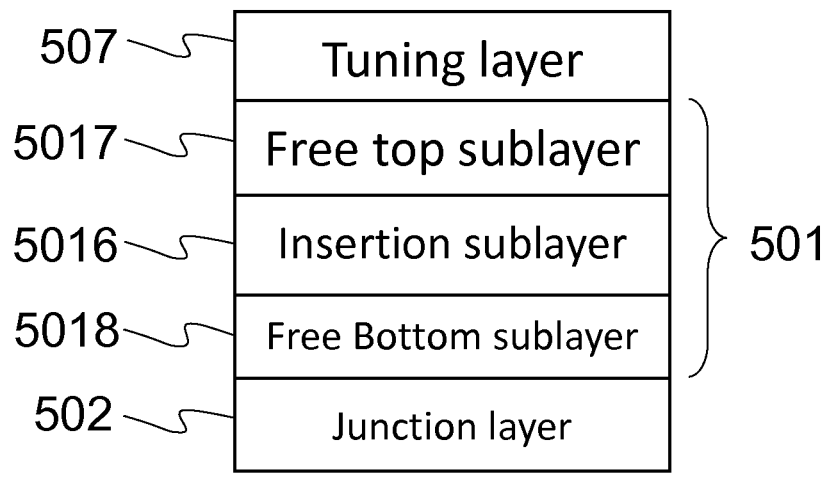

FIG. 19 shows the free layer portion of an STTMRAM element 500 in accordance with still another embodiment of the present invention.

Figure 20:
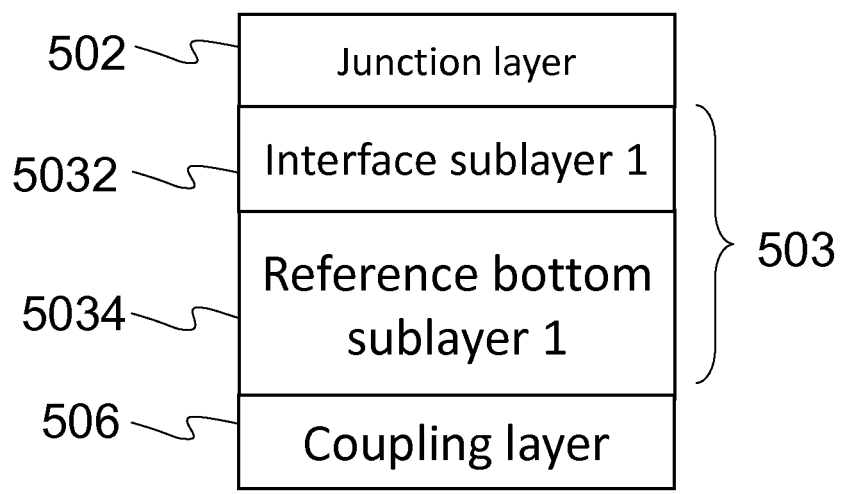

FIG. 20 shows the reference layer portion of an STTM-RAM element 500 in accordance with an embodiment of the present invention.

Figure 21:
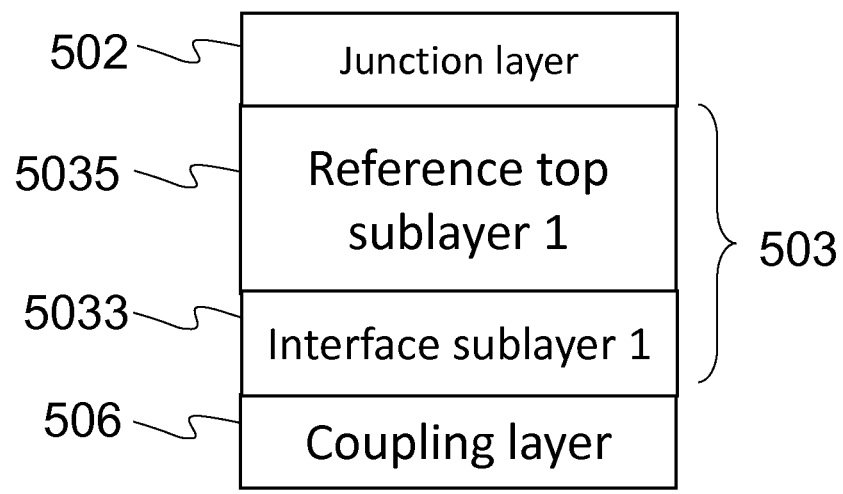

FIG. 21 shows the reference layer portion of an STTM-RAM element 500 in accordance with another embodiment of the present invention.

Figure 22:
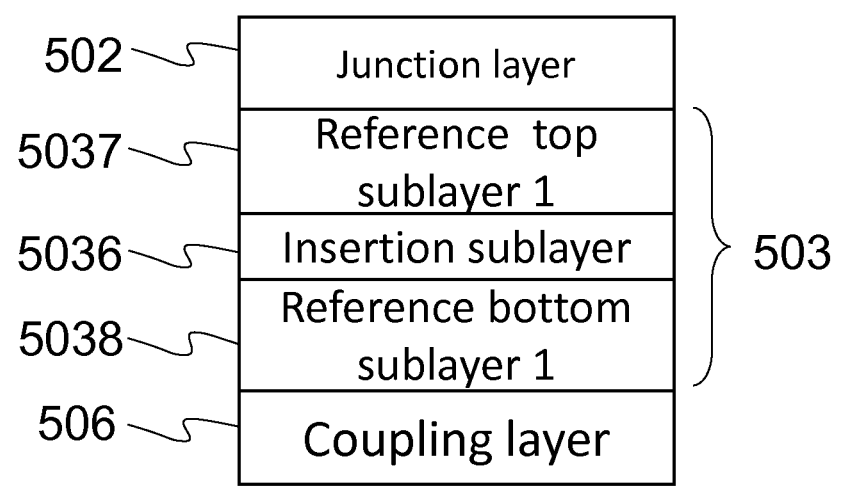

FIG. 22 shows the reference layer portion of an STTM-RAM element 500 in accordance with still another embodiment of the present invention.

Figure 23:
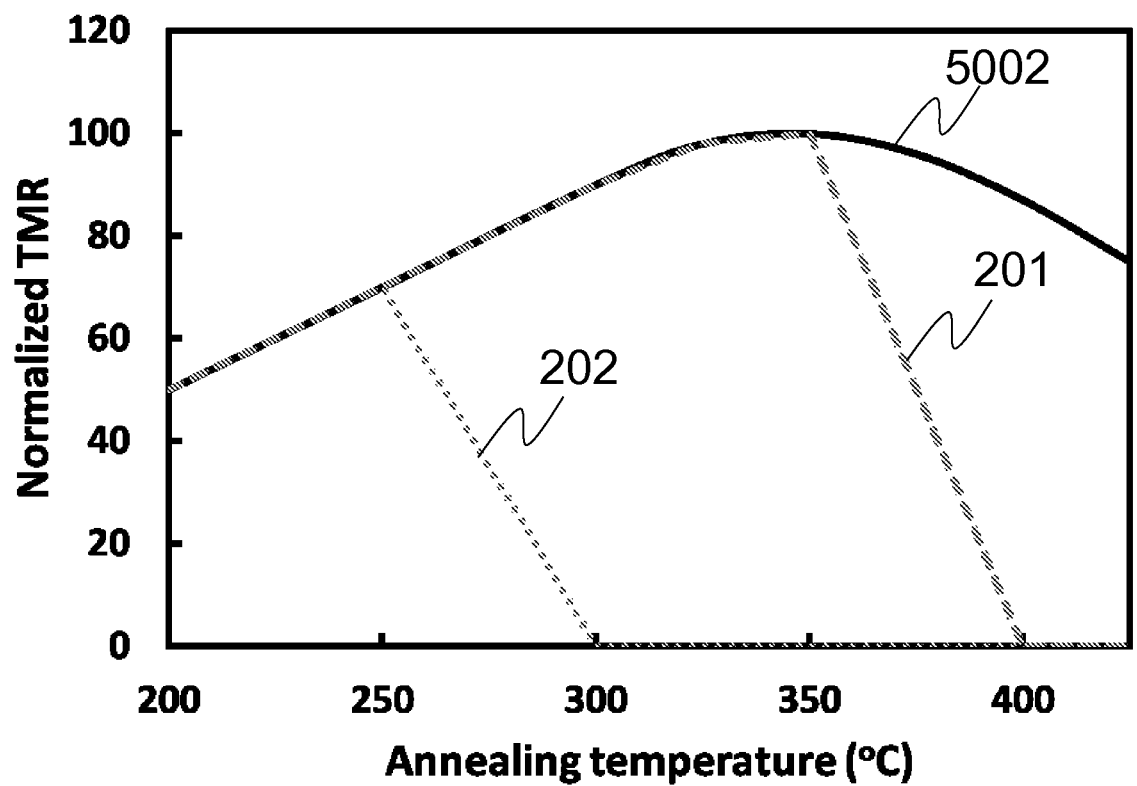

FIG. 23 shows TMR dependence curves on annealing temperature for STTMRAM elements 10, 100, and 500.

Figure 24:
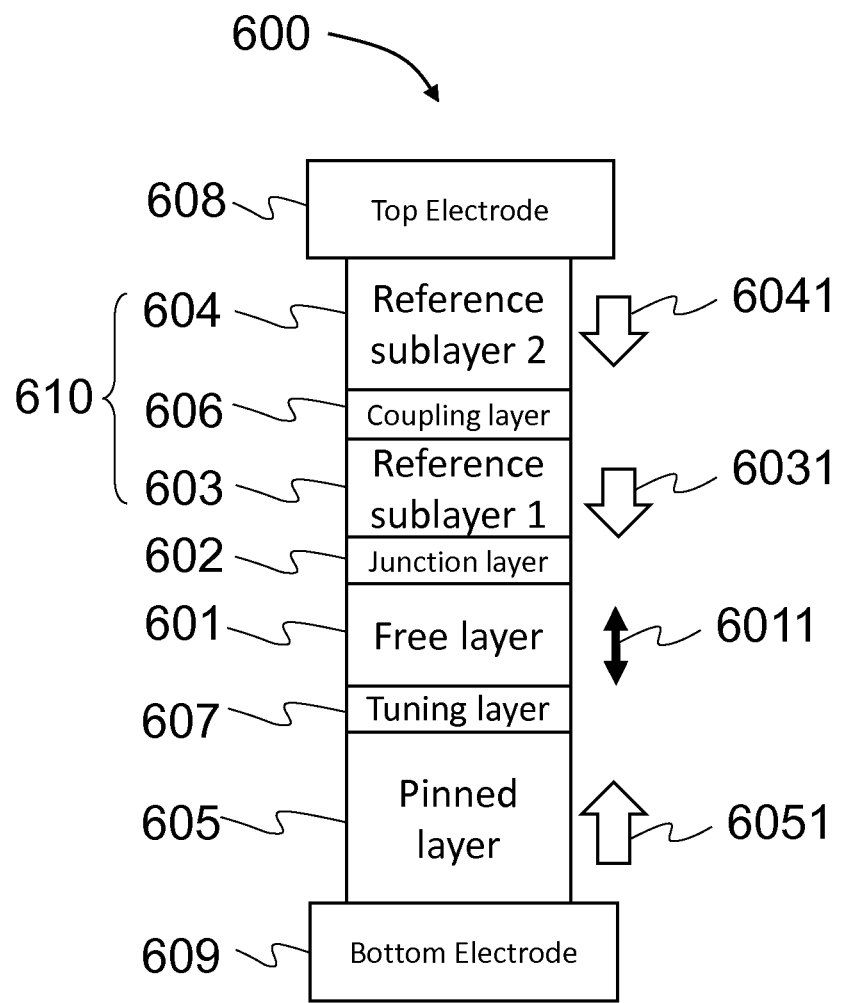

FIG. 24 shows an STTMRAM element according to still another embodiment of the present invention.

DETAILED DESCRIPTION OF THE PREFERRED EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

In an embodiment of the present invention, a spin transfer torque magnetic random access memory (STTMRAM) element and a method of manufacturing the same is disclosed. Relevant layers of the STTMRAM element include a reference layer, formed on a substrate, with a perpendicular magnetic component that is fixed in one direction. A junction layer is formed on top of the reference layer and a free layer is formed on top of the junction layer and has a magnetic orientation, at substantially the center of it that is perpendicular relative to the substrate and parallel and switchable relative to the reference layer. Further, a spacer layer is formed on top of the free layer and a fixed layer is formed on top of the spacer layer, the fixed layer having a perpendicular magnetic component associated therewith that is fixed in a direction opposite to that of the reference layer. The free layer is capable of switching its magnetic orientation relative to the fixed layer when electrical current is applied to the STTM-RAM element. The perpendicular magnetic components of the fixed layer and the reference layer substantially cancel each other and the free layer has a magnetization field at its edge that is in-plane relative to the substrate.

Figure 4:
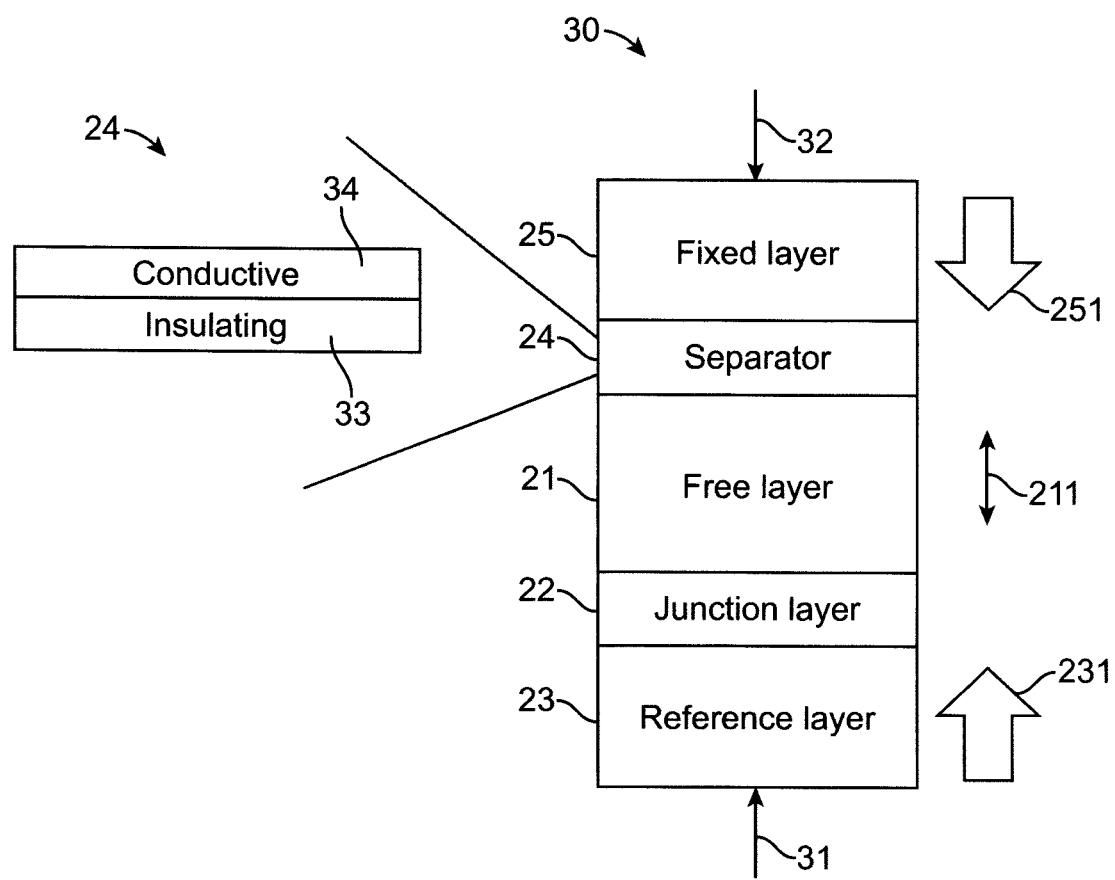

In an alternative embodiment, a stack is formed of multiple STTMRAM elements where each element is formed on top of another element allowing the stack to store more than one state. FIG. 4 shows the relevant portion of a spin transfer torque magnetic random access memory (STTMRAM) element 30, in accordance with an embodiment of the present invention. The STTMRAM element 30 is shown to include a reference layer 23, sometimes referred to as a "fixed layer", on top of which is formed a junction layer 22, sometimes referred to as a "barrier layer" or a "tunnel layer" or a "barrier tunnel layer" or a "tunnel barrier layer", on top of which is formed a free layer 21, sometimes referred to as a "switching layer", on top of which is formed a separator layer 24, sometimes referred to as a "spacer layer", on top of which is formed a fixed layer 25, sometimes referred to as a "reference layer". It is understood that other layers, not shown in FIG. 4, may be and are typically formed on top of the layer 25, below the layer 23 and/or in between any of the layers shown in FIG. 4.

The layer 23 is shown to have a magnetic moment (also known as magnetic orientation) in a direction shown by the arrow 231, the layer 21 is shown to have a magnetic moment in a direction shown by the arrow 211 and the layer 25 is shown to have a magnetic moment in a direction shown by the arrow 251. An electrical current is applied, either at 31 or at 32, to the element 30 during read and write operations. The element 30 is generally used to store digital information during write or program operations and this information is read during read operations. For these operations, various devices are coupled thereto that are not shown in FIG. 4. For a description of these devices and methods of reading from and writing to the element 30, the reader is directed to U.S. patent application Ser. No. 11/674,124, filed on Feb. 12, 2007, by Rajiv Yadav Ranjan, and entitled "Non-Uniform Switching Based Non-Volatile Magnetic Based Memory", the disclosures of which are incorporated herein by reference.

The element 30 has a perpendicular anisotropy in that the layer 21 has a magnetic moment that is perpendicular relative to that of the film on top of which the element 30 is formed. Similarly, the layers 25 and 23 have such a perpendicular anisotropy. The element 30 switches states and stores a digital value corresponding to the magnetic orientation of the layer 21 in that when this orientation is parallel to the magnetic orientation of the layer 23, the element 30 is in one state, generally referred to as "parallel", and when the orientation of the layer 21 is not parallel, or anti-parallel, relative to the orientation of the layer 23, the element 30 is in another state. These different states result in unique resistances across the MRAM stack. In this manner, the digital value of '1' or '0' is distinguished during read/write operations.

The layers 23 and 25 are made generally of material that is known in the art to be used for such fixed layer. Similarly, the layer 21 is made of material typically used by the industry for making a free layer, as is the layer 22 made of material known for making a tunnel layer. The layer 24, in some embodiments, is a multi-layer, made of at least one insulating layer 33, shown in the exploded view of the layer 24 at the left side of FIG. 4, and at least one conductive layer 34. While one of each of the insulating and conductive layers is shown, it is understood that 'n' number of such a configuration may comprise the layer 24, with 'n' being an integer value. However, the conductive and insulating layers alternate such that no two conductive layers are adjacent to each other and no two insulating layers are adjacent to each other. The insulating layer is made of an insulating material, such as but not limited to any of the following: alumina ($Al_2O_3$), magnesium oxide (MgO), silicon dioxide ($SiO_2$), and oxide of other metallic material, and the conductive layer is made of a conductive material, such as any of the following: ruthenium (Ru), tantalum (Ta), copper (Cu), silver (Ag), gold (Au) and any other metallic non-magnetic element or alloy. Thus, the conductive layer is non-magnetic. In alternative embodiments, the insulating layer 33 is formed on top of the conductive layer 34.

Figure 7:
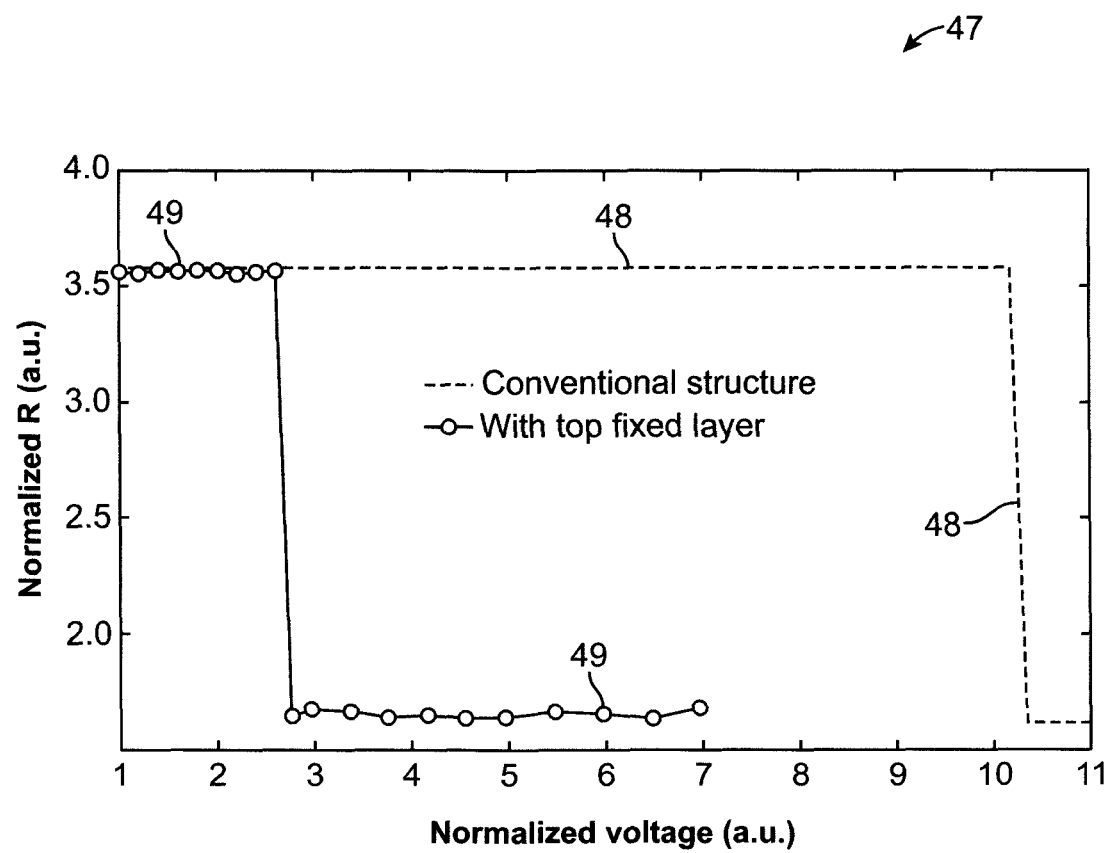
FIG. 7 shows a graph 47 of the performance of the element 30, in accordance with an embodiment of the present invention.

In some embodiments, the layer 24 is a single layer made of a non-magnetic material. The make-up of the layer 24, coupled with the configuration of the element 30, particularly using the layer 25 on top of the layer 24, as shown, cause the presence of magnetic fields at substantially the outer perimeter (edges) of the layer 21 with each such magnetic field having an in-plane magnetic orientation. These in-plane magnetic fields at the outer edge of the layer 21 effectively reduce the effect of the high perpendicular Hc, which, as previously discussed, prevents the free layer to readily switch magnetization states in prior art magnetic memories. Accordingly, switching between the states of the element 30 is eased and in this respect requires lower threshold voltage and current. As is shown in FIG. 7 herein, approximately 70% reduction in voltage is realized by the embodiment of FIG. 4 over that of prior art structures.

Figure 5:
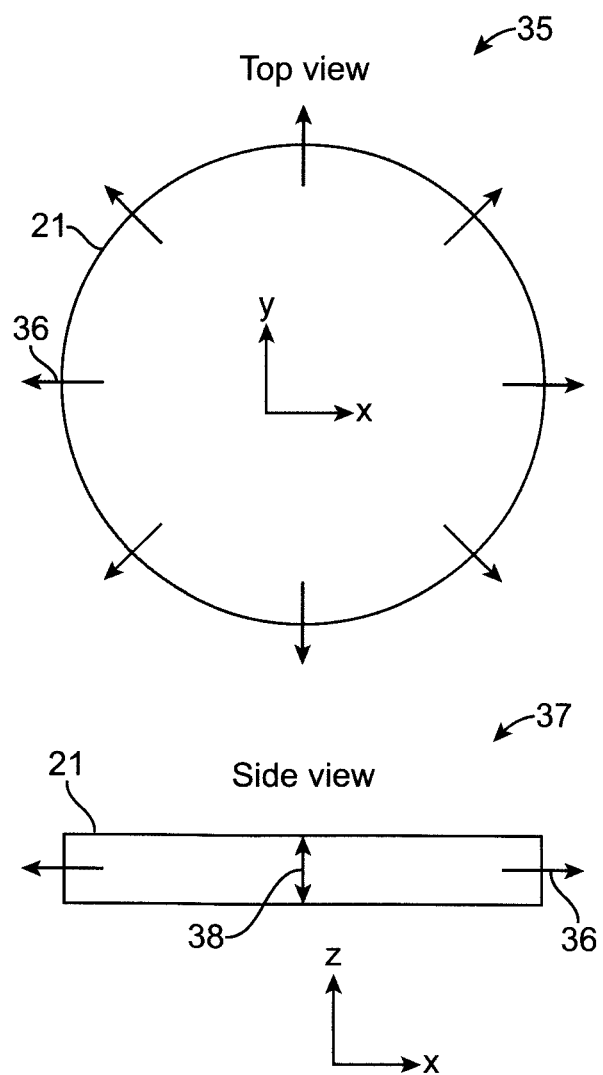

FIG. 5 shows a top view 35 of the layer 21 and a side view 37 of the layer 21, in accordance with an embodiment of the present invention. As shown, in-plane magnetization field 36, appearing at the edges of the layer 21 are present despite the perpendicular magnetization field 38, at substantially the center of the layer 21 that is switchable for storing purposes. The field 36 helps to reduce the effect of high perpendicular Hc at the edge of the layer 21, thereby causing the layer 21 to switch with more ease.

Figure 6:
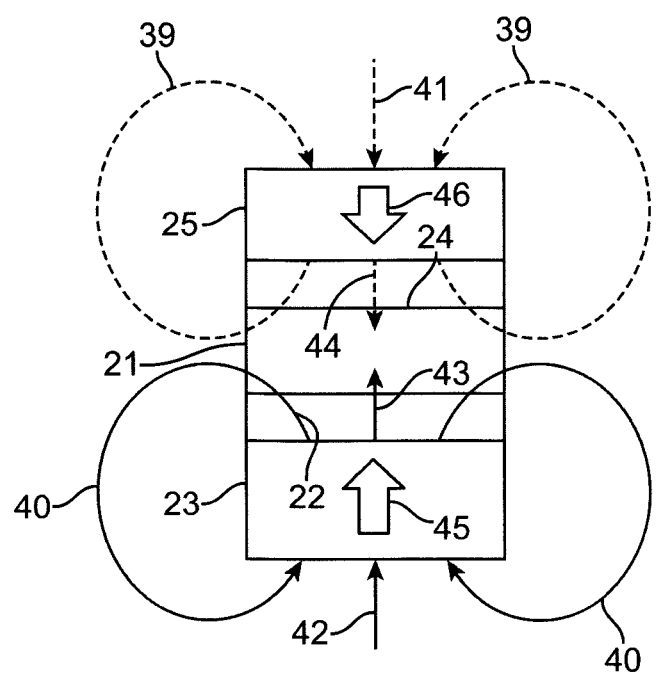

FIG. 6 shows the relevant magnetization fields of the layer 23, 22, 21, 24 and 25 of the element 30, in accordance with an embodiment of the present invention. The perpendicular magnetic fields, appearing substantially at the center, of the layers 23, 22, 24 and 25, are each shown in a direction consistent with the arrows 45, 43, 44 and 46, respectively. Magnetization directions of layer 23 and layer 25 are perpendicular relative to the plane of the substrate and opposite relative to each other and not necessarily required to follow the depicted directions in FIG. 6 and in alternative embodiments are in reverse directions than that shown in FIG. 6.

The magnetization of the layer 25 creates the field shown by the arrow 41 and the magnetization of the layer 23 creates the field shown by the arrow 42. The layer 23 is also shown to have significant in-plane magnetic components or fields 40, at its edges, in a direction shown by the arrows associated with the fields 40. Similarly, the layer 25 is shown to have significant in-plane magnetic fields 39, at its edges, in a direction shown by the arrows of the fields 39. In the case of the layer 21, the magnetic field of the layer 25 imposes onto the layer 21 and is in large part perpendicular at substantially the center of the layer 21 and the layer 23, as shown by the arrow 44, which extends through the layer 24 such that the perpendicular magnetic field of the layer 24 is substantially the same as that of the layer 25. Similarly, the magnetic field of the layer 23 onto the layer 21 is in large part perpendicular at substantially the center of the layer 21, as shown by the arrow 43, which extends through the layer 22 such that the perpendicular magnetic field of the layer 22 is the same as that of the layer 23.

The perpendicular magnetic fields of the layers 25 and 23 essentially cancel each other while the in-plane magnetic fields at the edges of the layer 21, fields 39 and 40, enhance each other and therefore reduce the effective Hc that would typically be present at the edges of prior art structures. Accordingly, not only does the process of switching states becomes easier and requires less voltage and current, switching is also advantageously substantially symmetrical.

Furthermore, by optimizing the spacing between the layers 25 and 21, the magnetic moment of the layers 23 and 25, the layer 21 can be made to switch at different voltages due to a difference in the magnitude of in-plane edge fields in the layer 21. For a greater understanding of the effect of the edge field on the switching voltage, a graph is shown and discussed relative to FIG. 7 and FIG. 8. By increasing the thickness of layer 24, layer 25 is further separated from the layer 21, thereby creating a weaker magnetic field in layer 21 than when the thickness of layer 24 is not so increased. To still fully compensate for the vertical field from layer 23 into the layer 21, magnetic moment of layer 25 can increase. While the vertical field is compensated, the edge in-plane field from the layer 25 onto layer 21 is lower than before as the spacing between layer 21 and layer 25 increases. Thus, with a lower edge in-plane field in layer 21, layer 21 would be harder to switch than before.

Figure 1:
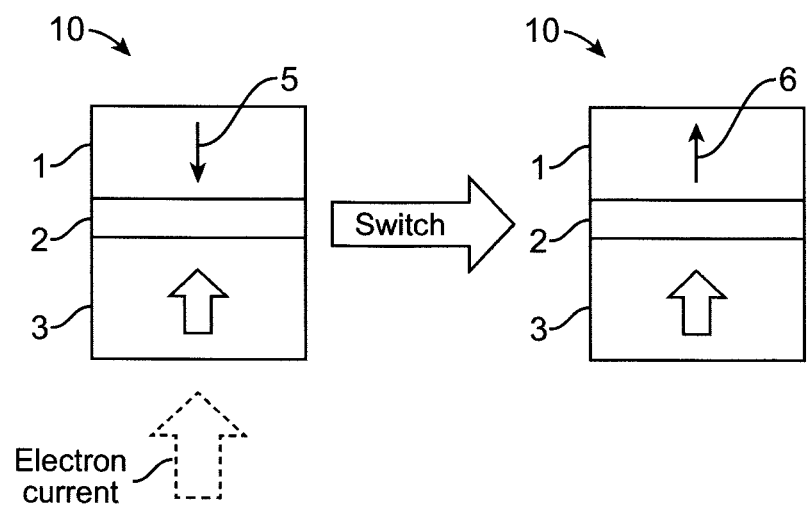
Figure 3:
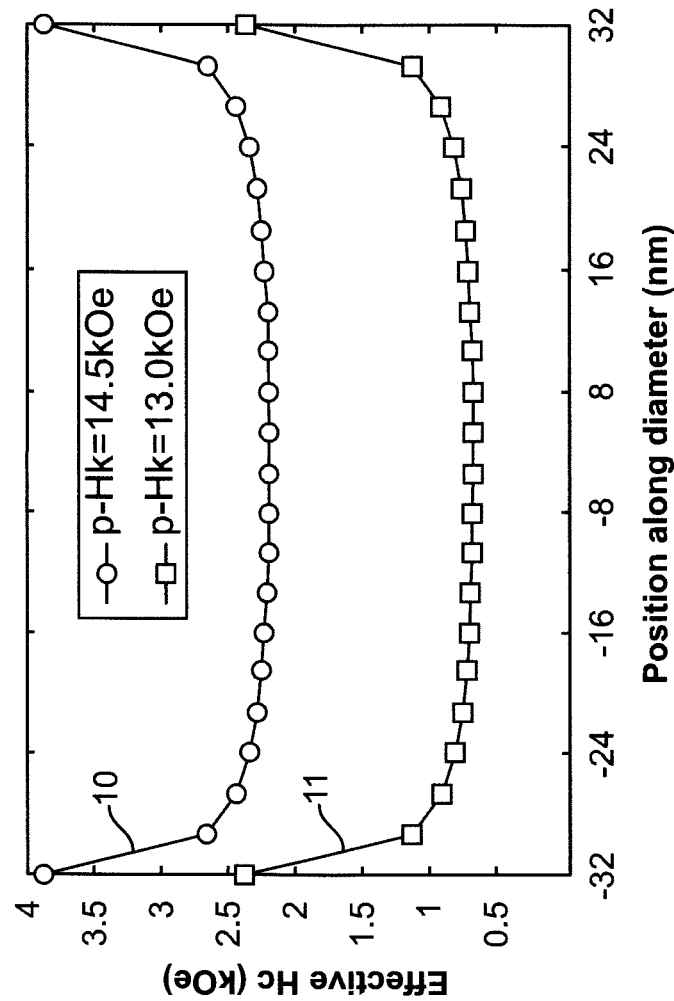
Figure 2:
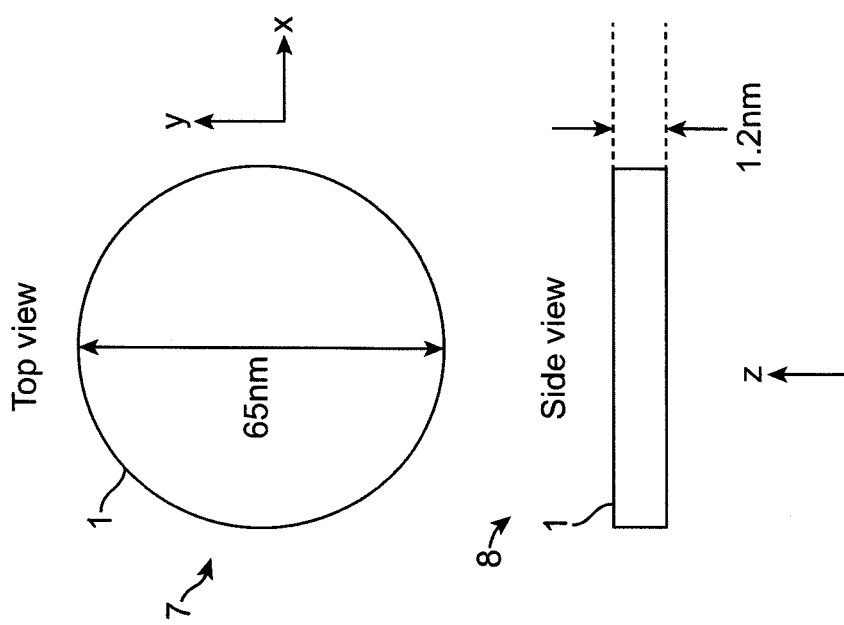

FIG. 7 shows a graph 47 of the performance of the element 30 vs. a conventional MRAM structure as in FIG. 1, in accordance with an embodiment of the present invention. Graph 47 is shown to have a y-axis indicative of the normalized resistance, in arbitrary unit (a.u.) vs. an x-axis indicative of the normalized switching voltage, in a.u., of the voltage required to switch the free layer in an MRAM structure from anti-parallel to reference layer, i.e. high resistance, state to parallel, i.e. low resistance, state, where the drop in the curves marked the switching voltage of the free layer. The dashed line shown at 48 is the performance of a conventional magnetic random access memory element as in FIG. 1 and the line, shown at 49, with circles thereon is the performance of the element 30. As shown by the graph 47, the element 30 exhibits far lower switching voltage than its counterpart structure. A reduction of more than 70% in the switching voltage is realized.

Figure 8:
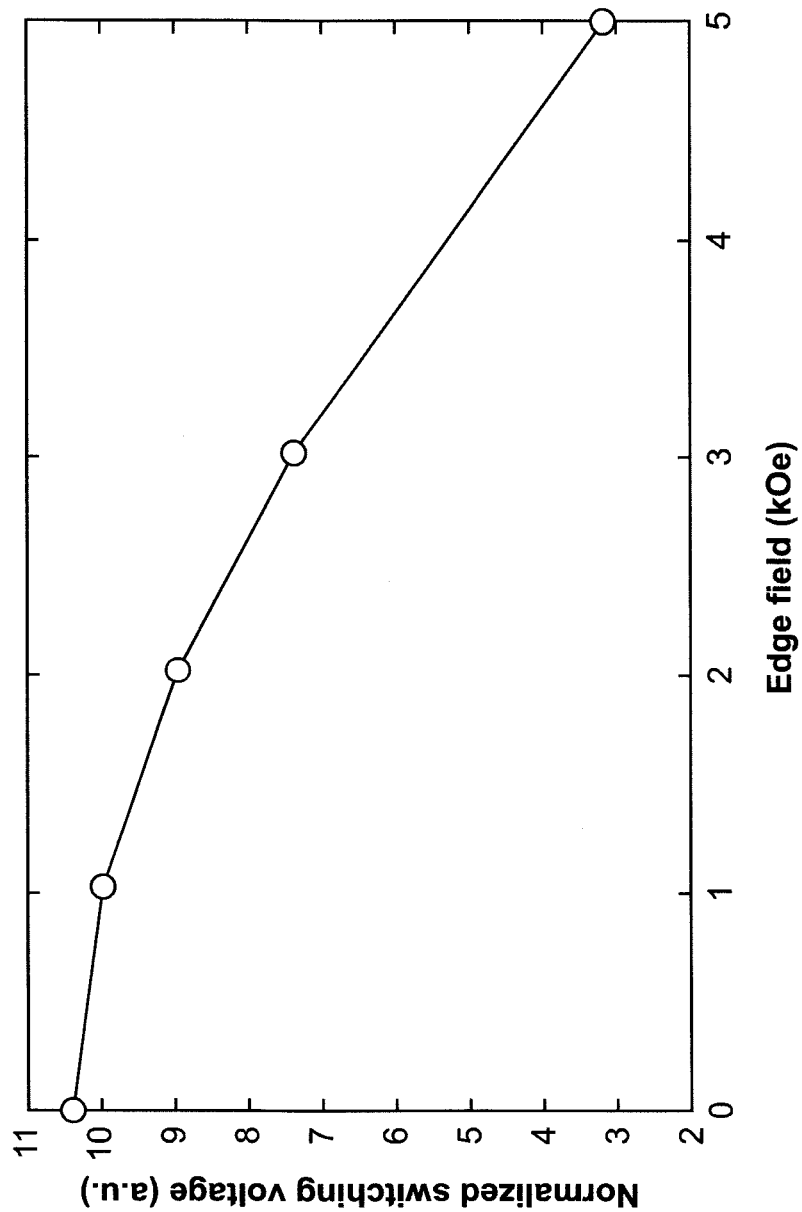
FIG. 8 shows a graph of the normalized switching voltage of the element 30 as the in-plane magnetic edge field of its layer 21 increases.

FIG. 8 shows a graph of the normalized switching voltage of the element 30 as the in-plane magnetic edge field of its layer 21 increases. The graph of FIG. 8 has a y-axis that represents the normalized switching voltage of the element 30 in a.u. and an x-axis that represents the in-plane edge magnetic field of the layer 21, in kOe. As shown, the switching voltage reduces faster at higher in-plane edge magnetic field of the element 30. For example, at the normalized switching voltage of 10, the edge field is approximately zero whereas at the normalized switching voltage of approximately 5.5, the edge field is approximately 4. Thus, by controlling the edge field, the layer 21 can be made to switch states at different voltages.

FIG. 9 shows a graph of the performance of the element 30 when various strengths of edge field, including none, are applied to the layer 21 of the element 30. The graph of FIG. 9 includes a y-axis representing the normalized resistance, in a.u., of the element 30 relative to the normalized voltage, in a.u., of the element 30, shown by the x-axis, when there is no in-plane edge field applied, shown at 50, and when an in-plane edge field of 1 kOe is applied, as shown at 51, and when an in-plane edge field of 2 kOe is applied, as shown at 52, and when an in-plane edge field of 3 kOe is applied, as shown at 53, and when an in-plane edge field of 5 kOe is applied, as shown at 54. As shown, with the applied in-plane edge field increasing from none to 5 kOe, the voltage required to switch the layer 21 advantageously decreases from 10.4 to 3.2, which is approximately a 70% reduction.

FIG. 10 shows the relevant portion of a spin transfer torque magnetic random access memory (STTMRAM) stack 55, in accordance with an embodiment of the present invention. The stack 55 is shown to include the layers of the element 30 and on top of the layer 25 thereof is shown formed a spacer layer 34 on top of which is shown formed free layer 31 on top of which is shown formed junction layer 32 on top of which is shown formed reference layer 33. The layers 21-23 form an MTJ 56 and the layers 31, 32 and 33 form an MTJ 57. Thus, MTJs 56 and 57 are stacked. Because two MTJs form the stack 55, the stack 55 is capable of storing two states. It is understood that the stack 55 may employ any number of MTJs and clearly, the more MTJs employed, the greater the number of states that can be stored in the stack 55. Thus, the stack 55 is considered to be a multi-state element.

Similar to the layer 24, the layer 34 is non-magnetic, in one embodiment of the present invention, and is accordingly made of an insulating layer or a conductive layer. In other embodiments, the layer 34, again similar to the layer 24, is multi-layered and made of any number of alternating oxide and conductive layers. The layers 31, 32 and 33 are made of material analogous to that of the layers 21-23, respectively. In some embodiments, the thicknesses of the layers 31, 32 and 33 are analogous to those of the layers 21-23, respectively, and in alternative embodiments, the thicknesses of the layers 31, 32 and 33 are different than those of the layers 21-23, respectively. The layers 23 and 33 have different magnetic moments in some embodiments, and similar magnetic moments in other embodiments. Different moments cause different fields in the respective free layers and thus different edge fields and different switching voltages associated with each of the free layers, even when the free layers are identical in material and/or thickness. The layers 24 and 34 each has a different thickness relative to the other. The effective in-plane edge magnetic field of the layer 21, as produced by the layers 23 and 25, is different than the effective in-plane edge magnetic field of the layer 31, which is produced by the layers 25 and 33. This is largely due to the requirement of each of the layers 21 and 31 having a unique current density to switch, as known to those skilled in the art. That is, briefly, the MTJs of the stack 55 cause it to be a multi-state element where each MTJ's unique switching current density results in a different state being programmed to from a multi-level cell. Accordingly, the effective in-plane magnetic edge field of each of the MTJs must also be at a different strength.

Layer 25 in FIG. 10 is a single magnetic layer in some embodiments and a magnetic multilayer structure with magnetic layers interleaved by non-magnetic layer in other embodiments. Such non-magnetic layer can be metallic, or metal oxide, or interlacing of both.

FIG. 11 shows the formation of the stack 55, in relevant part and accordance with a method of the present invention, as two steps. After the formation of the layers of the stack 55, field 60 is applied to the stack 55 to magnetize the layers 23, 33 and 25 such that the direction of magnetization at the center of each of these layers is substantially pointing in the same direction as the direction of magnetization at the center of the rest of these layers, as shown by the arrows 231, 331, and 251, respectively. Also, the magnetic orientation at the center of each of the layers 23 and 25 and 33 is parallel relative to that of the others. Field 60 has an orientation consistent with the direction of the arrow shown at field 60. This completes Step 1 but in this configuration, clearly, the magnetic fields at the center of the layers 25 and 23 do not cancel each other. Thus, next, at Step 2, field 61 is applied to the stack 55. The direction of the magnetic orientation of field 61 is consistent with the direction of the arrow shown at field 61, which is opposite to that of field 60. Field 61 is lower in strength than field 60 and only magnetizes the layer 25 to a direction that is opposite to that of the layers 23 and 33. In other embodiments, field 61, while still lower than field 60, only magnetizes the layers 23 and 33 such that these layers' magnetization orientation becomes opposite to that of the layer 25, which is shown at Step 3. Thus, after Step 1, either Step 2 is performed or Step 3 is performed. It is noted that the foregoing method of forming the stack 55 can also be applied to the element 30 when it is being manufactured.

In accordance with another method of forming the stack 55 and/or the element 30, the field 60 is applied while the layers of the stack/element are being formed, during the MTJ deposition and annealing, readily known in the art. A temperature of greater than 200 degrees Celsius during the annealing of the MTJ can be used during such a process.

FIG. 12 shows the formation of the stack 30, in relevant part and accordance with another method of the present invention, as two steps. After the formation of the layers of the stack 30, as described relative to FIG. 4, at step 1, field 70 is applied to the stack 30 to magnetize the layers 23 and 25 such that the direction of magnetization of each of these layers is substantially pointing in the same direction as shown by the arrows 231, and 251, respectively. At this point, the process either continues to Step 2 or to Step 3. Assuming Step 2 is performed next, field 72 is applied to the stack 30. The direction of the magnetic orientation of field 72 is consistent with the direction of the associated arrows, which is opposite to that of field 70. Field 72 is lower in strength than field 70 and in some embodiments only magnetizes the layer 23 in the direction shown and in other embodiments magnetizes the layer 25 in a direction substantially opposite to that of the layer 23.

Alternatively, after Step 1, Step 3 is performed in a manner analogous to Step 2 except that the layer 25 has a magnetization direction that is opposite to that which it took on at Step 1 but remains opposite to that of the layer 23 because the layer 23 is magnetized, in Step 3, in the same direction as that which it took on at Step 1. At step 3, field 74 is applied to the element 30 to effectuate the foregoing magnetizations. The direction of field 74, as shown, dictates the directions of magnetizations of the layers 23 and 25, at Step 3.

In accordance with another method of forming the element 30, the field 70 is applied while the layers of the stack/element are being formed, during the MTJ deposition and annealing, readily known in the art. A temperature of greater than 200 degrees Celsius during the annealing of the MTJ can be used during such a process. The fields 72 and 74 are applied to the element 30 after the formation of the latter.

It should be noted that in order to achieve the anti-parallel orientation of the magnetizations 231 and 251 of the reference layer 23 and the fixed layer 25, respectively, as shown in FIG. 4 using the processes described in FIG. 12, the fixed layer 25 and reference layer 23 need to have different switching fields of their magnetizations. Thus, magnetizations 231 and 251 of the reference layer 23 and the fixed layer 25, respectively, can be switched to the same direction with an applied high field. With an application of a lower field in between the switching fields of the reference layer 23 and the fixed layer 25 in the opposite direction, magnetization of only one of the reference layer 23 and the fixed layer 25 may be switched to the opposite direction to attain an antiparallel orientation of the magnetizations 231 and 251.

FIG. 13 illustrates an STTMRAM element 100 in accordance with another embodiment of the present invention. The element 100 includes a non-magnetic seed layer 101, a magnetic free layer 102 formed on top of the non-magnetic seed layer 101, a magnetic reference layer 109 separated from the magnetic free layer 102 by an insulating tunnel junction layer 103, a magnetic pinned layer 108 exchange coupled to the magnetic reference layer 109 through a Ru layer 107. The magnetic reference layer 109 comprises a magnetic interface reference layer 104 made of a CoFeB alloy and a magnetic top reference layer 106 formed thereabove with a Ta layer 105 interposed therebetween. The magnetic top reference layer 106 and the magnetic pinned layer 108 may have a face centered cubic (FCC) lattice structure, while the magnetic interface reference layer 104 and the magnetic free layer 102 may have a body centered cubic (BCC) lattice structure. The insulating tunnel junction layer may have a cubic lattice structure.

The magnetic free layer 102 of the element 100 is analogues to the free layer 1 of the element 10 and is typically made of a CoFeB alloy or a CoFeB based alloy. The magnetic interface reference layer 104 of the element 100 is analogous to the reference layer 3 of the element 10 and is typically made of a CoFeB alloy or a CoFeB based alloy. The tunnel junction layer 103 of the element 100 is analogous to the junction layer 2 of the element 10 and is typically made of a material comprising magnesium oxide (MgO).

Post-deposition annealing of the elements 10 and 100 may be needed to attain the desired crystalline structures described above. During the annealing process, a BCC lattice structure will form at the interface of the magnetic free layers 1 and 102 with the junction layers 2 and 103 and the magnetic reference layers 3 and 104 with the junction layers 2 and 103 in both the elements 10 and 100 because each of the magnetic layers 1, 3, 102, and 104 is made of a CoFe based alloy or a boron-depleted CoFeB alloy. The MgO junction layers 2 and 103 will form a cubic structure that matches the BCC structure at the junction interfaces of the magnetic free layers 1, 102 and the magnetic reference layers 3, 104 in the elements 10 and 100. The magnetic free layers 1 and 102, as well as the magnetic reference layers 3 and 104 gain TMR signal and perpendicular magnetic anisotropy from this BCC interface crystalline structure matching with the MgO tunnel junction layers 2 and 103. Hence, it is desirable to have a MgO tunnel layer with a high degree of crystallinity to interface with the magnetic reference and free layers made of CoFe based alloys with high degrees of BCC crystallinity.

The STTMRAM element 100 also includes the magnetic top reference layer 106 and the tantalum layer 105. The magnetic top reference layer 106 couples to the magnetic interface reference layer 104 by magneto-static coupling or magnetic exchange couple through the Ta layer 105. Thus, the magnetizations 141 and 161 of the magnetic interface reference layer 104 and the magnetic top reference layer 106, respectively, are always aligned in parallel. The Ru layer 107 is disposed next to the magnetic top reference layer 106, opposite the Ta layer 105. The magnetic pinned layer 108 is disposed next to the Ru layer 107. The magnetization direction 181 of the magnetic pinned layer 108 is opposing the magnetization directions 141 and 161 of the magnetic reference layers 104 and 106. The magnetic pinned layer 108 exchange couples to the magnetic top reference layer 106 by anti-ferromagnetic-exchange coupling generated through the Ru layer 107. Thus, the magnetic pinned layer 108 helps maintain an anti-parallel orientation of the magnetization 161 to magnetization 181. The magneto-static field generated by the magnetic pinned layer 108 in the magnetic free layer 102 partially or completely cancels the effective magnetic field generated by the magnetic reference layers 104 and 106 in the magnetic free layer 102. To attain a high perpendicular anisotropy, the magnetic top reference layer 106 and the magnetic pinned layer 108 of the element 100 are made of super-lattice structures, such as Co/Pt, Co/Pd and Co/Ni, where the super-lattice structure has either a FCC structure or a crystalline structure that is different from the BCC structure of the magnetic interface reference layer 104 and the magnetic free layer 102. Therefore, after annealing, if the annealing temperature is sufficiently high and the annealing time is sufficiently long, the non-BCC lattice structure of the magnetic top reference layer 106 and the magnetic pinned layer 108 may propagate to affect the crystal structures of the magnetic interface reference layer 104, the tunnel junction layer 103, and even the magnetic free layer 102, thereby degrading the BCC crystalline structures and corresponding perpendicular anisotropy of the magnetic reference layer 104 and the magnetic free layer 102, and resulting in lower final TMR value for the STTM-RAM element 100. Moreover, non-magnetic elements of the super-lattice, such as Pt, Pd, and Ni, may also migrate or diffuse into the junction layer 103 and further reduce the perpendicular anisotropies of the magnetic interface reference layers 104 and the magnetic free layer 102, which further reduces the TMR value of the memory element 100. While it is possible to use the Ta layer 105 as a diffusion barrier for the above mentioned non-magnetic elements and as a barrier against propagation of non-BCC crystalline structures of the magnetic top reference layer 106 and the magnetic pinned layer 108, the thickness of the Ta layer 105 is very thin, generally less than 1 nm, because of the need for the magnetic top reference layer 106 coupling to the magnetic interface reference layer 104. Under conditions of sufficiently high annealing temperature and/or sufficiently long annealing time, the barrier properties of the thin Ta layer 105 may be degraded and the perpendicular anisotropies of the magnetic interface reference layer 104 and the magnetic free layer 102 will be reduced, resulting in lower TMR for the memory element 100.

Foundry operations at backend of the line (BEOL) may see temperatures as high as 400° C. Hence, it is desirable to have a thermally stable memory element so that perpendicular anisotropies of magnetic layers and TMR thereof do not get undesirably affected and reduced. The MTJ element of an STTMRAM device needs to survive such a temperature range.

FIG. 14 shows exemplary normalized TMR vs annealing temperature trends 201 and 202 for the memory elements 10 and 100, respectively. As annealing temperature rises, the TMR for the memory element 10 is significantly reduced at a temperature of 400° C. while the TMR for the memory element 100 is reduced at as low as 300° C. owing to the existence of non-BCC structures of the magnetic top reference layer 106 and the magnetic pinned layer 108.

Thus, it would be desirable to have an MTJ element structure for STTMRAM application in which the magnetic fields exerted by the magnetic pinned layer and magnetic reference layer on the free layer effectively cancel each other. It is also advantageous to have an MTJ element structure in which FCC or other non-BCC crystalline structures of magnetic layers in the reference or pinned layer do not reduce the perpendicular anisotropy of the free layer or other magnetic layers after high temperature annealing treatment, thereby preventing the degradation of the TMR of the MTJ element.

FIG. 15 shows an embodiment of the present invention as applied to an MTJ element 500 of an STT-MRAM device. The MTJ element 500 is similar to the MTJ element 30 of FIG. 4. The MTJ element 500 inherits all the benefits and advantages of the MTJ element 30 of FIG. 4. With continuing reference to FIG. 15, the MTJ stack is disposed between a top electrode 508 and a bottom electrode 509, which are connected to a bit line (not shown) and a selection transistor (not shown), respectively, of the STTMRAM device. The MTJ stack comprises a perpendicular magnetic reference layer 510 formed on top of the bottom electrode 509, an insulating tunnel junction layer 502 formed on top of the magnetic reference layer 510, a perpendicular magnetic free layer 501 formed on top of the junction layer 502, a non-magnetic tuning layer 507 formed on top of the perpendicular magnetic free layer 501, and a perpendicular magnetic pinned layer 505 formed on top of the non-magnetic tuning layer 507 and capped by the top electrode layer 508. The magnetic reference layer 510 further comprises a first reference sublayer 503 and a second reference sublayer 504 with a non-magnetic coupling layer 506 interposed therebetween. The second reference sublayer 504 has a magnetization 5041; the first reference sublayer 503 has a magnetization 5031; the perpendicular magnetic free layer 501 has a magnetization 5011; and the perpendicular magnetic pinned layer 505 has a magnetization 5051, wherein the magnetizations 5041, 5031, 5011 and 5051 are all oriented perpendicularly to the film plane. The magnetization 5011 of the perpendicular magnetic free layer 501 can be switched into one of the two orientations along the direction perpendicular to the film plane with the application of an electric current flowing through the MTJ stack between the top electrode 508 and bottom electrode 509 during the operation of the STTMRAM device. The magnetization 5051 of the magnetic pinned layer 505 and the magnetizations 5031 and 5041 of the first and second reference sublayers 503 and 504, respectively, are fixed during the operation of the STTMRAM device. The magnetization 5051 of the magnetic pinned layer 505 is opposing the magnetizations 5031 and 5041 of the first and second reference sublayers 503 and 504, respectively.

The magnetic reference layer 510 of the MTJ element 500 functions similarly as the reference layer 23 of the MTJ element 30 in FIG. 4. The magnetic pinned layer 505 of the MTJ element 500 functions similarly as the fixed layer 25 of the MTJ element 30. The magnetic free layer 501 of the MTJ element 500 functions similarly as the free layer 21 of the MTJ element 30. The magnetic pinned layer 505 and the magnetic reference layer 510 have different switching fields, similar to the fixed layer 25 and the reference layer 23 shown in FIG. 12 to enable antiparallel orientations of the magnetization 5051 and the magnetizations 5031 and 5041 of the magnetic reference layer 510 as shown in FIG. 15 by an external field setting process similar to that illustrated and described in FIG. 12. In the MTJ element 500, the first and second reference sublayers 503 and 504 are exchange coupled or magneto-static coupled through the non-magnetic coupling layer 506, and their magnetizations 5031 and 5041 are aligned in the same direction during the operation of the MTJ element 500. Therefore, the coupling layer 506 and the first and second reference sublayers 503 and 504 can be combined and regarded as a single reference layer 510 with a single magnetization. Similar to the fixed layer 25 and the reference layer 23 of the MTJ element 30 in FIG. 4, the magnetic pinned layer 505 and the magnetic reference layer 510 have different coercivity fields, or switching fields, so that the anti-parallel orientation between the magnetization 5051 and magnetizations 5031 and 5041 as shown in FIG. 15 can be attained by following the field initialization process illustrated and described in FIG. 12. With the pinned layer 505 having a different switching field than the magnetic reference layer 510, a magnetic field applied to the MTJ element 500 in the perpendicular direction can orient the magnetization of one of the magnetic pinned layer 505 and the magnetic reference layer 510 to a direction that is opposite and antiparallel to the other layer without affecting the magnetization orientation of the other layer.

The function of the non-magnetic tuning layer 507 in the MTJ element 500 is to adjust the offset field in the magnetic free layer 501 to as close to zero as possible. The magnetization 5051 of the magnetic pinner layer 505 and the magnetizations 5031 and 5041 of the magnetic reference layer 510 generate magnetic fields (mainly magneto-static fields) in the magnetic free layer 501 in the perpendicular direction. With the anti-parallel orientation between the magnetization 5051 and the magnetizations 5031 and 5041, the magnetic fields produced in the free layer 501 by the magnetic pinned layer 505 and the magnetic reference layer 510 may cancel each other. When such field cancellation is not perfect, a net external field will exist in the magnetic free layer 501 and is called an offset field. The offset field causes the magnetic free layer 501 to exhibit behavior of asymmetric switching by magnetic field or electric current, which is not desirable for the STT-MRAM application. The thickness of the tuning layer 507 can be adjusted to control the magnetic field exerted on the magnetic free layer 501 by the magnetic pinned layer 505, resulting in close to zero offset field in the magnetic free layer 501.

FIG. 16A shows the normalized offset field in the magnetic free layer 501 as a function of the tuning layer thickness for various values of "magnetization thickness product" 1611-1613. In FIG. 16A, the magnetic pinned layer 505 has a constant "magnetization thickness product", i.e. Mst, which is a quantitative measurement of the effective magnetic moment of a magnetic layer and is a product of the effective magnetization of a magnetic layer and the thickness of the same magnetic layer. The magnetic reference layer 510 has varying Mst 1611-1613, which can occur when the effective Ms of the magnetic reference layer 510 changes and/or the thicknesses of the magnetic layers 503 and 504 of the reference layer 510 change. The effective offset field of the magnetic free layer 501 is plotted against the thickness of the tuning layer 507 for three different Mst values of the reference layer 510 as illustrated by the curves 1611-1613. The three curves 1611-1613 cross the zero offset field level at the tuning layer thickness of t11, t12 and t13, respectively. The Mst values of the magnetic reference layer 510 corresponding to the curves 1611 and 1613 are highest and lowest, respectively, with the Mst value corresponding to the curve 1612 in between. FIG. 16A shows that with the Mst value of the pinned layer 505 being constant, a higher Mst value of the magnetic reference layer 510 requires a thinner thickness of the tuning layer 507 to maintain an about zero offset field in the magnetic free layer 501 with t11 being smaller than t12 and t12 being smaller than t13.

FIG. 16B shows similar plots as that of FIG. 16A, only that the magnetic reference layer 510 now has a constant Mst value, while the magnetic pinned layer 505 has varying Mst values, which can occur when the effective Ms of the magnetic pinned layer 505 changes and/or the thickness of the same layer 505 changes. The effective offset field of the magnetic free layer 501 is plotted as a function of the thickness of the tuning layer 507 for three different Mst values of the magnetic pinned layer 505 as represented by curves 1621-1623. The three curves 1621, 1622, and 1623 cross the zero offset field level at tuning layer thickness of t21, t22 and t23, respectively. The Mst values of the magnetic pinned layer 505 corresponding to the curves 1621 and 1623 are lowest and highest, respectively, with the Mst value corresponding to the curve 1622 in between. FIG. 16B shows that with the Mst value of the magnetic reference layer 510 being constant, a higher Mst value of the magnetic pinned layer 505 requires a thicker thickness of the tuning layer 507 to achieve close to zero offset field in the free layer 501 with t21 being smaller than t22 and t22 being smaller than t23.

Referring now to FIG. 15, the magnetic free layer 501 preferably comprises a CoFeB alloy and has a BCC lattice structure according to an embodiment of the present invention. The Fe content of magnetic free layer 501 is preferably 40 atomic percent (at. %) or more and more preferably 60 at. % or more. The B content is preferably 30 at. % or less and more preferably 20 at. % or less.

FIG. 17 shows the magnetic free layer 501 may further comprise a free top sublayer 5014 and a free interface sublayer 5012 formed on top of the junction layer 502 according to an embodiment of the present invention. The free interface sublayer 5012 may comprise a CoFe, Fe, or CoFeB based alloy with a B content of 10 at. % or less. This free interface sublayer 5012 can be deposited as a thin individual layer with thickness of less than 1.0 nm. This free interface sublayer 5012 can also be the result of annealing the MTJ element 500 to deplete the B content at the interface of the magnetic free layer 501 with the junction layer 502. The free interface sublayer 5012 can function as a spin-polarization enhancement layer that helps to increase the TMR of the MTJ element 500 through the junction layer 502. This free interface sublayer 5012 can also serve as a perpendicular anisotropy enhancement layer for the magnetic free layer 501, the perpendicular anisotropy of which is partially or entirely produced by the interface between the magnetic free layer 501 and the junction layer 502.

In another embodiment of the present invention, the magnetic free layer 501 may comprise a free bottom sublayer 5015 and a free interface sublayer 5013 disposed next to the tuning layer 507 as illustrated in FIG. 18. The free interface sublayer 5013 may comprise a CoFe, Fe, or CoFeB based alloy with a B content of 10 at. % or less. This free interface sublayer 5013 can also include at least one of the following elements: Ta, Hf, Zr, and V. The free interface sublayer 5013 can be directly deposited as a thin individual layer with thickness of less than 1.0 nanometer or can be the result of annealing the MTJ element 500 to deplete the B content at the interface of the magnetic free layer 501 with the tuning layer 507. The free interface sublayer 5013 can also serve as a perpendicular anisotropy enhancement layer for the free layer 501, the perpendicular anisotropy of which is at least partially produced by the interface between the magnetic free layer 501 and the tuning layer 507.

In still another embodiment of the present invention, the magnetic free layer 501 may comprise a free bottom sublayer 5018 and a free top sublayer 5017 with a free layer insertion sublayer 5016 interposed therebetween, as illustrated in FIG. 19. The free layer insertion sublayer 5016 may comprise a metal or alloy made of Ta, CoFeTa, CoFeBTa, Hf, CoFeHf, CoFeBHf, Zr, CoFeZr, CoFeBZr, V, CoFeV, or CoFeBV. The free layer insertion sublayer 5016 may be directly deposited as a thin individual layer with thickness of less than 1.0 nm and allows exchange coupling of the free bottom sublayer 5018 to the free top sublayer 5017. Because of the thin thickness of the free layer insertion sublayer 5016, the free bottom sublayer 5018 exchange coupled to the free top sublayer 5017 behave like a single free layer 501 during operation as the magnetizations of the same layers 5017 and 5018 always switch together. The free layer insertion sublayer 5016 can also act as a perpendicular anisotropy enhancement layer (PEL) for the free layer 501 to enhance the surface perpendicular anisotropy of the free layer 501 produced by the interface of the free layer 501 with the junction layer 502 and by the interface of the free layer 501 with the tuning layer 507.

Now, referring back to FIG. 15, the insulating junction layer 502 is a tunnel junction layer made of magnesium oxide (MgO) with a cubic lattice structure according to an embodiment of the present invention. In some embodiments, the junction layer 502 may comprise at least one of the following oxide materials: magnesium oxide, aluminum oxide, titanium oxide, and zinc oxide.

The first reference sublayers 503 is substantially similar to the magnetic free layer 501 in structure and composition and is preferably made of a CoFeB or CoFeB based alloy having a BCC lattice structure according to an embodiment of the present invention. The Fe content is preferably 40 at. % or higher and more preferably 60 at. % or higher. The B content is preferably 30 at. % or lower and more preferably 20 at. % or lower.

According to another embodiment, the first reference sublayer 503 may further comprise a first reference bottom sublayer 5034 and a first reference interface sublayer 5032 formed thereabove as illustrated in FIG. 20. The first reference interface sublayer 5032 is formed adjacent to the junction layer 502 and may comprise a metal or alloy made of CoFe, Fe, or CoFeB with a B content of 10 at. % or lower. The first reference interface sublayer 5032 can be directly deposited as a thin individual layer with thickness of less than 1.0 nanometer or can also be the result of annealing the MTJ element 500 to deplete the B content at the interface of the first reference sublayer 503 with the junction layer 502. The first reference interface sublayer 5032 can function as a spin-polarization enhancement layer that helps to increase the TMR of the MTJ element 500 through the junction layer 502. The first reference interface sublayer 5032 can also serve as perpendicular anisotropy enhancement layer for the first reference sublayer 503, the perpendicular anisotropy of which is partially or entirely produced by the interface between the first reference sublayer 503 and junction layer 502.

According to still another embodiment, the first reference sublayer 503 may comprise a first reference interface sublayer 5033 and a first reference top sublayer 5035 formed thereabove, as illustrated in FIG. 21. The first reference interface sublayer 5033 is formed adjacent to the coupling layer 506 and may comprise a magnetic metal or alloy made of CoFe, Fe, or CoFeB with a B content of 10 at. % or lower. The first reference interface sublayer 5033 may also contain at least one of the following elements: Ta, Hf, Zr, and V. The first reference interface sublayer 5033 can be directly deposited as a thin individual layer with thickness of less than 1.0 nanometer or can also be the result of annealing the MTJ element 500 to deplete the B content at the interface of the first reference sublayer 503 with the coupling layer 506. The first reference interface sublayer 5033 can also serve as a perpendicular anisotropy enhancement layer for the first reference sublayer 503, the perpendicular anisotropy of which is at least partially produced by the interface between the first reference sublayer 503 and the coupling layer 506.

According to yet another embodiment of the present invention, the first reference sublayer 503 may comprise a first reference bottom sublayer 5038 and a first reference top sublayer 5037 with a first reference insertion sublayer 5036 interposed therebetween, as illustrated in FIG. 22. The first reference insertion sublayer 5036 may comprise a metal or alloy made of Ta, CoFeTa, CoFeBTa, Hf, CoFeHf, CoFeBHf, Zr, CoFeZr, CoFeBZr, V, CoFeV, or CoFeBV. The first reference insertion sublayer 5036 may be deposited as a thin individual layer with thickness of less than 1.0 nanometer and allows direct exchange coupling of the first reference bottom sublayer 5038 to the first reference top sublayer 5037 therethrough. Because of thin thickness of the layer 5036, the first reference bottom sublayer 5038 exchange coupled to the first reference top sublayer 5037 behave like a single first reference sublayer 503 during operation and the magnetizations of the same layers 5037 and 5038 always switch together. The first reference insertion sublayer 5036 can also act as a perpendicular anisotropy enhancement layer (PEL) for the first reference sublayer 503 to enhance the surface perpendicular anisotropy of the same layer 503 produced by the interface of the first reference sublayer 503 with the junction layer 502 and by the interface of the first reference sublayer 503 with the coupling layer 507.

Referring back to FIG. 15, the magnetic pinned layer 505 may comprise a high perpendicular anisotropy material such that its switching field is sufficiently high that during operation of the MTJ element 500, the magnetization 5051 of the magnetic pinned layer 505 is fixed. The magnetization 5051 can be switched by an externally applied strong magnetic field that is higher than the switching field of the magnetic pinned layer 505. The high perpendicular anisotropy of the magnetic pinned layer 505 is generated by the crystalline or lattice structure thereof. In an embodiment of the present invention, the magnetic pinned layer 505 may be made of FePt, CoCrPt, or a material comprising Co, Fe, or Ni, and at least one element from the group of platinum (Pt), chromium (Cr), and palladium (Pd). In another embodiment, the magnetic pinned layer 505 may comprise a supper-lattice structure formed by repeated interlacing of a magnetic layer and a weak magnetic or non-magnetic layer, in which the magnetic layer is made of Co, Fe, or CoFe and the weak magnetic or non-magnetic layer is made of Pd, Pt, or Ni. Super-lattice structures may be made by repeated interlacing of base pairs of Co/Pt, Co/Pd, Co/Ni, CoFe/Pt, CoFe/Pd, and CoFe/Ni, where a hybridization of different base pairs can also be employed. Most known materials and structures with high anisotropy for the magnetic pinned layer 505, as discussed above, have crystalline or lattice structures that are different from the BCC lattice structure of the magnetic free layer 501 at the interface next to the junction layer 502 and the cubic lattice structure of the junction layer 502. The lattice and crystalline structure of the magnetic pinned layer 505 being different from BCC makes it necessary to isolate the lattice structure of the magnetic pinned layer 505 from the lattice structures of the magnetic free layer 501 and the junction layer 502. Lattice mismatch or interference between the magnetic pinned layer 505 and the magnetic free layer 501 and the junction layer 502 will lead to degradation of the junction layer 502 (when FCC or other lattice structure of the magnetic pinned layer 505 propagates to the magnetic free layer 501 and the junction layer 502 during annealing), thereby lowering the TMR, and/or degradation of the perpendicular anisotropy of the magnetic pinned layer 505 (when the lattice structures of the magnetic free layer 501 and the junction layer 502 propagate to affect the FCC or other lattice structure of the magnetic pinned layer 505). Additionally, the magnetic pinned layer 505 may contain elements, such as Pd, Pt, Ni, and Cr, that may undesirably diffused into the junction layer 502 or the magnetic free layer 501, as the presence of these elements will reduce the TMR of the MTJ element 500. Hence, in addition to controlling the offset field in the magnetic free layer 501, the tuning layer 507 needs to function as a diffusion barrier and a lattice interference barrier to prevent element diffusion and lattice interference between the magnetic pinned layer 505 and the layers of the magnetic free layer 502 and the junction layer 502.

The tuning layer 507 is preferably non-magnetic or is substantially non-magnetic with a thickness larger than 1 nm, and most preferably with a thickness in the range of about 2 nm to about 10 nm. In an embodiment of the present invention, the tuning layer 507 may comprise a non-magnetic conductive material made of Ta, Ti, TaN, TiN, W, or any combination thereof. The tuning layer 507 is preferably made of Ta with a thickness range of about 2 nm to about 5 nm. The Ta layer promotes perpendicular anisotropy of the magnetic free layer 501 generated from the interface of the magnetic free layer 501 and the junction layer 502 by enhancing B depletion from the magnetic free layer 501 interface with the junctions layer 502, thereby forming a higher degree of BCC lattice at the interface of the magnetic free layer 501 with the junction layer 502 while preventing element diffusion and lattice interference between the magnetic pinned layer 505 and the layers of the magnetic free layer 502 and the junction layer 502.

In some embodiments, the tuning layer 507 may also include a non-magnetic seed layer (not shown in FIG. 15) formed adjacent to the magnetic pinned layer 505 for enhancing epitaxial growth of the magnetic pinned layer 505 into a preferred lattice or crystalline structure with a high perpendicular anisotropy. The non-magnetic seed layer may be made of Ru, Cu, TiCr, Cr, Al, or any combination thereof. In some embodiments where the magnetic pinned layer 505 is made of Co/Ni super-lattice, the tuning layer 507 preferably comprises a TaN diffusion barrier layer having a thickness range of about 2 nm to about 4 nm and a Cu seed layer with a thickness range of about 1 nm to about 2 nm formed thereabove.

In another embodiment, the tuning layer 507 may have a multi-layer structure that includes a thin oxide layer with a thickness of less than 2 nm at the interface next to the magnetic free layer 501 and a conductive upper layer formed adjacent to the magnetic pinned layer 505. The resistivity of the oxide layer is lower than the resistivity of the junction layer 502 and no TMR signal is produced from this oxide layer. A multi-layer example is the MgO/Ta structure, where the MgO layer (not shown in FIG. 15) with a thickness range of about 0.5 nm to about 1.1 nm is formed adjacent to the magnetic free layer 501 and the Ta layer with a thickness of about 2 nm or thicker formed adjacent to the magnetic pinned layer 505. The MgO layer can enhance the perpendicular anisotropy within the magnetic free layer 501 at interface thereof with the MgO layer.

Alternatively, the tuning layer 507 may also have a multi-layer structure of MgO/CoFeB/Ta, where the MgO is formed adjacent to the magnetic free layer 501 and has a thickness of about 0.5 nm to about 1.1 nm, the CoFeB layer has a thickness of about 0.2 nm to about 0.6 nm, and the Ta layer is formed next to the magnetic pinned layer 505 and has a thickness of about 2 nm or thicker. The CoFeB layer is magnetically "dead" and does not produce discernible magnetic moment at thickness range thereof. The purpose of the CoFeB layer in the tuning layer 507 is to enhance the formation of BCC structure in the magnetic free layer 501 through the MgO layer of the tuning layer 507, thereby achieving higher perpendicular anisotropy in the magnetic free layer 501.

The second reference sublayer 504 of FIG. 15 is similar to the magnetic pinned layer 505 in composition and structure. The second reference sublayer 504 is preferably formed of a thermally stable material such that elements thereof do not diffuse into the first reference sublayer layer 503 and the junction layer 502. It is also desirable that the non-BCC structure of the second reference sublayer 504 does not propagate to affect the lattice structures of the first reference sublayer layer 503 and the junction layer 502.

Like the tuning layer 507, the coupling layer 506 is a non-magnetic layer which may function as a diffusion barrier for preventing inter-diffusion between the second reference sublayer 504 and the layers of the first reference sublayer 503 and the junction layer 502. The coupling layer 506 may also prevent the lattice interference or mismatch between the second reference sublayer 504 and the layers of the first reference sublayer 503 and the junction layer 502. However, unlike the tuning layer 507, the coupling layer 506 is sufficiently thin to provide strong enough magnetic coupling between the second reference sublayer 504 and the first reference sublayer 503. Thus, the thickness of the coupling layer 506 is preferably thinner than that of the tuning layer 507.

In an embodiment of the present invention, the coupling layer 506 may be a non-magnetic conductive layer made of Ta, Ti, TaN, TiN, W, or any combination thereof. The non-magnetic coupling layer 506 is preferably made of Ta with a thickness range of about 0.3 nm to about 0.8 nm. The second reference sublayer 504 and the first reference sublayer 503 couples to each other by direct magnetic exchange coupling through the coupling layer 506 owing to thin thickness thereof. Alternatively, the coupling layer 506 may be a Ta layer with a thickness range of about 2 nm or thicker. At this thickness range, the second reference sublayer 504 and the first reference sublayer 503 couple to each other through magneto-static fields. The coupling layer 506 made of a thicker Ta promotes the perpendicular anisotropy of the first reference sublayer 503 generated from the interface of the first reference sublayer 503 and the junction layer 502 by enhancing B depletion from the interface of the first reference sublayer 503 with the junctions layer 502, thereby forming a higher degree of BCC lattice at the interface of the first reference sublayer 503 with the junction layer 502 while preventing element inter-diffusion and lattice interference or mismatch between the second reference sublayer 504 and the layers of the first reference sublayer 503 and the junction layer 502.

In another embodiment, the coupling layer 506 may have a multi-layer structure that includes a thin oxide layer with a thickness of less than about 2 nm formed at the interface adjacent to the first reference sublayer 503 and a conductive bottom layer formed adjacent to the second reference sublayer 504. The electrical resistivity of the oxide layer is lower than that of the junction layer 502 and no TMR signal is produced from this oxide layer when a spin polarization current is applied to the MTJ element 500. A multi-layer example of the coupling layer 506 is a Ta/MgO structure, where the MgO layer (not shown) with a thickness range of about 0.5 nm to about 1.1 nm is formed adjacent to the first reference sublayer 503 and the Ta layer thickness is in the range of about 1 nm or thicker. The MgO layer can enhance the perpendicular anisotropy within the first reference sublayer 503 at interface thereof with the MgO layer.

Alternatively, the multi-layer structure of the coupling layer 506 may have a Ta/CoFeB/MgO structure, in which the MgO with a thickness in the range of about 0.5 nm to about 1.1 nm is an interface layer formed adjacent to the first reference sublayer 503; the CoFeB layer has a thickness range of about 0.2 nm to about 0.6 nm; and the Ta layer with a thickness range of about 1 nm or less. The CoFeB layer is magnetically "dead" and does not produce discernible magnetic moment at thickness range thereof. The purpose of the CoFeB layer in the coupling layer 506 is to enhance the formation of BCC structure in the first reference sublayer 503 through the MgO layer of the coupling layer 506, thereby achieving higher perpendicular anisotropy in the first reference sublayer 503.

The top electrode 508 and the bottom electrode 509 each comprises one or more of the following conductive materials: Ta, TaN, TiN, W, and Cu.

Below are some examples of the MTJ stack of the MTJ element 500 in between the top electrode 508 and the bottom electrode 509:

Example 1 the second reference sublayer 504 formed of repeated base pairs of Co/Pt, or Co/Pd, or Co/Ni super-lattice structure with the FCC lattice;
the coupling layer 506 formed of Ta with a thickness range of about 0.3 nm to about 0.8 nm;
the first reference sublayer 503 formed of a CoFeB alloy and having an interface layer with the BCC lattice structure next to the junction layer 502;
the junction layer 502 formed of MgO with a cubic lattice structure;
the magnetic free layer 501 formed of a CoFeB alloy and having an interface layer with the BCC lattice structure next to the junction layer 502;
the tuning layer 507 formed of Ta with a thickness range of about 2 nm or thicker; and
the magnetic pinned layer 505 formed of repeated base pairs of Co/Pt, or Co/Pd, or Co/Ni super-lattice structure with the FCC lattice.

Example 2 the second reference sublayer 504 formed of repeated base pairs of Co/Pt, or Co/Pd, or Co/Ni super-lattice structure with the FCC lattice;
the coupling layer 506 formed of Ta with a thickness of about 2 nm or thicker;
the first reference sublayer 503 formed of a CoFeB alloy and having an interface layer with the BCC lattice structure next to the junction layer 502;
the junction layer 502 formed of MgO with a cubic lattice structure;
the magnetic free layer 501 formed of a CoFeB alloy and having an interface layer with the BCC lattice structure next to the junction layer 502;
the tuning layer 507 formed of Ta with a thickness range of about 2 nm or thicker; and
the magnetic pinned layer 505 formed of repeated base pairs of Co/Pt, or Co/Pd, or Co/Ni super-lattice structure with the FCC lattice.

Example 3 the second reference sublayer 504 formed of repeated base pairs of Co/Pt, or Co/Pd, or Co/Ni super-lattice structure with the FCC lattice;
the coupling layer 506 formed of Ta with a thickness range of about 0.3 nm to about 0.8 nm;
the first reference sublayer 503 formed of a CoFeB alloy and having an interface layer with the BCC lattice structure next to the junction layer 502;
the junction layer 502 formed of MgO with a cubic lattice structure;
the magnetic free layer 501 formed of a CoFeB alloy and having an interface layer with the BCC lattice structure next to the junction layer 502;
the tuning layer 507 having a MgO/CoFeB/Ta structure, where the MgO layer with a thickness range of about 0.5 nm to about 1.1 nm is formed adjacent to the magnetic free layer 501; the CoFeB layer has a thickness range of about 0.2 nm to 0.6 nm; and the Ta layer with a thickness range of about 2 nm to about 3 nm is formed adjacent to the magnetic pinned layer 505; and
the magnetic pinned layer 505 formed of repeated base pairs of Co/Pt, or Co/Pd, or Co/Ni super-lattice structure with the FCC lattice.

Example 4 the second reference sublayer 504 formed of repeated base pairs of Co/Pt, or Co/Pd, or Co/Ni super-lattice structure with the FCC lattice;
the coupling layer 506 formed of Ta with a thickness of about 2 nm or thicker;
the first reference sublayer 503 formed of a CoFeB alloy and having an interface layer with the BCC lattice structure next to the junction layer 502;
the junction layer 502 formed of MgO with a cubic lattice structure;

the magnetic free layer 501 formed of a CoFeB alloy and having an interface layer with the BCC lattice structure next to the junction layer 502;

the tuning layer 507 having a MgO/CoFeB/Ta structure, where the MgO layer with a thickness range of about 0.5 nm to about 1.1 nm is formed adjacent to the magnetic free layer 501; the CoFeB layer has a thickness range of about 0.2 nm to 0.6 nm; and the Ta layer with a thickness range of about 2 nm to about 3 nm is formed adjacent to the magnetic pinned layer 505; and the magnetic pinned layer 505 formed of repeated base pairs of Co/Pt, or Co/Pd, or Co/Ni super-lattice structure with the FCC lattice.

Referring now to FIG. 23, which shows the normalized TMR as a function of the annealing temperature for the MTJ elements 10, 100, and 500. The curve 5002 corresponds to the MTJ element 500 with the above-described Example 1 configuration, while curves 201 and 202 corresponds the MTJ elements 10 and 100, respectively. As the annealing temperature reaches 400° C., the TMR values of the MTJ elements 10 and 100 markedly decrease owing to crystalline mismatch or inter-diffusion of elements from the pinned layer 108 and the reference layer 106 with the FCC lattice and Pt, Pd or Ni constituent to the BCC lattice structure around the junction layer 103. The TMR value of the MTJ element 500, however, still maintains at a high level even at 400° C. The MTJ element 500 has better thermal stability than the elements 10 and 100 because the tuning layer 507 and the coupling layer 506 can provide effective diffusion barrier and prevent the non-BCC structures from propagating to the magnetic layers adjacent to the junction layer 502.

The film stacking sequence of the MTJ element 500 illustrated in FIG. 15 can be reversed without affecting performance thereof. FIG. 24 shows the MTJ element 600 having the same film layers as the MTJ element 500 but with a reversed film stacking sequence. Accordingly, the element 600 comprises a magnetic pinned layer 605 formed on top of a bottom electrode 609, non-magnetic tuning layer 607 formed on top of the magnetic pinned layer 605, a magnetic free layer 601 formed on top of the non-magnetic tuning layer 607, an insulating tunnel junction layer 602 formed on top of the magnetic free layer 601, a magnetic reference layer 610 formed on top of the tunnel junction layer 602 and capped by a top electrode 608. The magnetic reference layer 610 further comprises a first reference sublayer 603 and a second reference sublayer 604 with a non-magnetic coupling layer 606 interposed therebetween. Each of the layers 601-610 has the same ranges of physical properties, structural compositions, and magnetic properties as the corresponding layer in the element 500 of FIG. 15. In other words, the element 600 is the element 500 placed upside down.

The second reference sublayer 604 has a magnetization 6041; the first reference sublayer 603 has a magnetization 6031; the perpendicular magnetic free layer 601 has a magnetization 6011; and the perpendicular magnetic pinned layer 605 has a magnetization 6051, wherein the magnetizations 6041, 6031, 6011 and 6051 are all oriented perpendicularly to the film plane. The magnetization 6011 of the perpendicular magnetic free layer 601 can be switched into one of the two orientations along the direction perpendicular to the film plan with the application of an electric current flowing through the MTJ stack between the top electrode 608 and bottom electrode 609 during the operation of the STTMRAM device. The magnetization 6051 of the magnetic pinned layer 605 and the magnetizations 6031 and 6041 of the first and second reference sublayers 603 and 604, respectively, are fixed during the operation of the STTMRAM device. The magnetization 6051 of the magnetic pinned layer 605 is opposing the magnetizations 6031 and 6041 of the first and second reference sublayers 603 and 604, respectively.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A spin transfer torque magnetic random access memory (STTMRAM) element comprising:
    a magnetic pinned layer having a first fixed magnetization direction substantially perpendicular to a film plane thereof;
    a magnetic free layer separated from said magnetic pinned layer by a non-magnetic tuning layer and having a variable magnetization direction substantially perpendicular to a film plane thereof; and
    a magnetic reference layer separated from said magnetic free layer by an insulating tunnel junction layer and having a second fixed magnetization direction substantially opposite to said first fixed magnetization direction provided in said magnetic pinned layer,
    wherein said tuning layer comprises an oxide layer formed adjacent to said magnetic free layer and a conductive layer formed adjacent to said magnetic pinned layer.

2. The STTMRAM element according to claim 1, wherein said magnetic pinned layer has a different lattice structure from said tunnel junction layer.

3. The STTMRAM element according to claim 1, wherein said magnetic pinned layer has an FCC lattice structure.

4. The STTMRAM element according to claim 1, wherein said magnetic pinned layer is formed of a material comprising at least one of Co, Fe, and Ni, and at least one of Pt, Cr, and Pd.

5. The STTMRAM element according to claim 1, wherein said magnetic pinned layer has a structure formed by repeated interlacing of base pair layers, one of said base pair layers comprises at least one of Co and Fe and the other one of said base pair layers comprises at least one of Pd, Pt, and Ni.

6. The STTMRAM element according to claim 1, wherein said magnetic pinned layer has a structure formed by repeated interlacing of base pair layers of Co/Pt, Co/Pd, Co/Ni, CoFe/Pt, CoFe/Pd, CoFe/Ni, or any combination thereof.

7. The STTMRAM element according to claim 1, wherein said conductive layer of said tuning layer comprises at least one of Ta, Hf, Zr, V, W, and N.

8. The STTMRAM element according to claim 1, wherein said magnetic free layer includes an interface layer with mainly a BCC lattice formed adjacent to said tunnel junction layer, said interface layer comprises a magnetic material selected from the group consisting of CoFe, Fe, and CoFeB.

9. The STTMRAM element according to claim 1, wherein said free layer comprises a CoFeB alloy.

10. The STTMRAM element according to claim 1, wherein said magnetic free layer includes an interface layer formed adjacent to said tuning layer, said interface layer comprises a magnetic material selected from the group consisting of CoFe, Fe, and CoFeB.

11. The STTMRAM element according to claim 10, wherein said interface layer further comprises at least one of Ta, Hf, Zr, and V.

12. The STTMRAM element according to claim 1, wherein said magnetic free layer comprises a first and second magnetic free sublayers with an insertion layer interposed therebetween.

13. The STTMRAM element according to claim 12, wherein each of said first and second magnetic free sublayers comprises a CoFeB alloy.

14. The STTMRAM element according to claim 12, wherein said insertion layer comprises a material selected from the group consisting of Ta, CoFeTa, CoFeBTa, Hf, CoFeHf, CoFeBHf, Zr, CoFeZr, CoFeBZr, V, CoFeV, CoFeBV, and any combination thereof.

15. The STTMRAM element according to claim 1, wherein said magnetic reference layer comprises a first magnetic reference layer formed adjacent to said tunnel junction layer and a second magnetic reference layer separated from said first magnetic reference layer by a coupling layer.

16. The STTMRAM element according to claim 15, wherein said second magnetic reference layer is formed of a material comprising at least one of Co, Fe, and Ni, and at least one of Pt, Cr, and Pd.

17. The STTMRAM element according to claim 15, wherein said second magnetic reference layer has a structure formed by repeated interlacing of base pair layers, one of said base pair layers comprises at least one of Co and Fe and the other one of said base pair layers comprises at least one of Pd, Pt, and Ni.

18. The STTMRAM element according to claim 15, wherein said second magnetic reference layer has a structure formed by repeated interlacing of base pair layers of Co/Pt, Co/Pd, Co/Ni, CoFe/Pt, CoFe/Pd, CoFe/Ni, or any combination thereof.

19. The STTMRAM element according to claim 15, wherein said first magnetic reference layer comprises a CoFeB alloy.

20. The STTMRAM element according to claim 1, wherein said tuning layer further comprises a seed layer formed between said conductive layer and said magnetic pinned layer, said seed layer comprises one of Ru, Cu, TiCr, Cr, and Al.

21. The STTMRAM element according to claim 20, wherein said tuning layer comprises a TaN conductive layer and a Cu seed layer, said magnetic pinned layer formed on top of said Cu seed layer has a Co/Ni multilayer structure.

22. The STTMRAM element according to claim 1, wherein said oxide layer of said tuning layer is made of magnesium oxide, aluminum oxide, or silicon oxide.

23. The STTMRAM element according to claim 1, wherein said conductive layer of said tuning layer is made of ruthenium, tantalum, copper, silver, or gold.

24. A spin transfer torque magnetic random access memory (STTMRAM) element comprising:
a magnetic pinned layer having a first fixed magnetization direction substantially perpendicular to a film plane thereof;
a magnetic free layer separated from said magnetic pinned layer by a non-magnetic tuning layer and having a variable magnetization direction substantially perpendicular to a film plane thereof; and
a magnetic reference layer separated from said magnetic free layer by an insulating tunnel junction layer and having a second fixed magnetization direction substantially opposite to said first fixed magnetization direction provided in said magnetic pinned layer,
wherein said magnetic pinned layer and said magnetic reference layer have different magnetic switching fields and are formed on opposite sides of said magnetic free layer, said tuning layer has a thickness that allows an offset field in said magnetic free layer as exerted by said magnetic pinned layer and said magnetic reference layer to be about zero, said magnetic reference layer comprises a first magnetic reference layer formed adjacent to said tunnel junction layer and a second magnetic reference layer separated from said first magnetic reference layer by a coupling layer, said coupling layer is formed of a non-magnetic conductive material comprising at least one of Ta, Hf, Zr, V, W, and N.

25. A spin transfer torque magnetic random access memory (STTMRAM) element comprising:
a magnetic pinned layer having a first fixed magnetization direction substantially perpendicular to a film plane thereof;
a magnetic free layer separated from said magnetic pinned layer by a non-magnetic tuning layer and having a variable magnetization direction substantially perpendicular to a film plane thereof; and
a magnetic reference layer separated from said magnetic free layer by an insulating tunnel junction layer and having a second fixed magnetization direction substantially opposite to said first fixed magnetization direction provided in said magnetic pinned layer,
wherein said magnetic pinned layer and said magnetic reference layer have different magnetic switching fields and are formed on opposite sides of said magnetic free layer, said tuning layer has a thickness that allows an offset field in said magnetic free layer as exerted by said magnetic pinned layer and said magnetic reference layer to be about zero, said magnetic reference layer comprises a first magnetic reference layer formed adjacent to said tunnel junction layer and a second magnetic reference layer separated from said first magnetic reference layer by a coupling layer, said first magnetic reference layer includes an interface layer with mainly a BCC lattice formed adjacent to said tunnel junction layer, said interface layer comprises a magnetic material selected from the group consisting of CoFe, Fe, and CoFeB with a B content of 10 at. % or less.

26. A spin transfer torque magnetic random access memory (STTMRAM) element comprising:
a magnetic pinned layer having a first fixed magnetization direction substantially perpendicular to a film plane thereof;
a magnetic free layer separated from said magnetic pinned layer by a non-magnetic tuning layer and having a variable magnetization direction substantially perpendicular to a film plane thereof; and
a magnetic reference layer separated from said magnetic free layer by an insulating tunnel junction layer and having a second fixed magnetization direction substantially opposite to said first fixed magnetization direction provided in said magnetic pinned layer,
wherein said magnetic pinned layer and said magnetic reference layer have different magnetic switching fields and are formed on opposite sides of said magnetic free layer, said tuning layer has a thickness that allows an offset field in said magnetic free layer as exerted by said magnetic pinned layer and said magnetic reference layer to be about zero, said magnetic reference layer comprises a first magnetic reference layer formed adjacent to said tunnel junction layer and a second magnetic reference layer separated from said first magnetic reference layer by a coupling layer, said first magnetic reference layer comprises a CoFeB alloy having a Fe content of at least 40 at. % and a B content of at most 20 at. %.

27. A spin transfer torque magnetic random access memory (STTMRAM) element comprising:
a magnetic pinned layer having a first fixed magnetization direction substantially perpendicular to a film plane thereof;
a magnetic free layer separated from said magnetic pinned layer by a non-magnetic tuning layer and having a variable magnetization direction substantially perpendicular to a film plane thereof; and
a magnetic reference layer separated from said magnetic free layer by an insulating tunnel junction layer and having a second fixed magnetization direction substantially opposite to said first fixed magnetization direction provided in said magnetic pinned layer,
wherein said magnetic pinned layer and said magnetic reference layer have different magnetic switching fields and are formed on opposite sides of said magnetic free layer, said tuning layer has a thickness that allows an offset field in said magnetic free layer as exerted by said magnetic pinned layer and said magnetic reference layer to be about zero, said magnetic reference layer comprises a first magnetic reference layer formed adjacent to said tunnel junction layer and a second magnetic reference layer separated from said first magnetic reference layer by a coupling layer, said first magnetic reference layer includes an interface layer formed adjacent to said coupling layer, said interface layer comprises a magnetic material selected from the group consisting of CoFe, Fe, and CoFeB with a B content of 10 at. % or less.

28. The STTMRAM element according to claim 27, wherein said interface layer further comprises at least one of Ta, Hf, Zr, and V.

29. A spin transfer torque magnetic random access memory (STTMRAM) element comprising:
a magnetic pinned layer having a first fixed magnetization direction substantially perpendicular to a film plane thereof;
a magnetic free layer separated from said magnetic pinned layer by a non-magnetic tuning layer and having a variable magnetization direction substantially perpendicular to a film plane thereof; and
a magnetic reference layer separated from said magnetic free layer by an insulating tunnel junction layer and having a second fixed magnetization direction substantially opposite to said first fixed magnetization direction provided in said magnetic pinned layer,
wherein said magnetic pinned layer and said magnetic reference layer have different magnetic switching fields and are formed on opposite sides of said magnetic free layer, said tuning layer has a thickness that allows an offset field in said magnetic free layer as exerted by said magnetic pinned layer and said magnetic reference layer to be about zero, said magnetic reference layer comprises a first magnetic reference layer formed adjacent to said tunnel junction layer and a second magnetic reference layer separated from said first magnetic reference layer by a coupling layer, said first magnetic reference layer comprises a first reference sublayer and a second reference sublayer with an insertion layer interposed therebetween.

30. The STTMRAM element according to claim 29, wherein each of said first and second reference sublayers comprises a CoFeB alloy.

31. The STTMRAM element according to claim 29, wherein said insertion layer comprises a material selected from the group consisting of Ta, CoFeTa, CoFeBTa, Hf, CoFeHf, CoFeBHf, Zr, CoFeZr, CoFeBZr, V, CoFeV, CoFeBV, and any combination thereof.

32. A spin transfer torque magnetic random access memory (STTMRAM) element comprising:
a magnetic pinned layer having a first fixed magnetization direction substantially perpendicular to a film plane thereof;
a magnetic free layer separated from said magnetic pinned layer by a non-magnetic tuning layer and having a variable magnetization direction substantially perpendicular to a film plane thereof; and
a magnetic reference layer separated from said magnetic free layer by an insulating tunnel junction layer and having a second fixed magnetization direction substantially opposite to said first fixed magnetization direction provided in said magnetic pinned layer,
wherein said magnetic pinned layer and said magnetic reference layer have different magnetic switching fields and are formed on opposite sides of said magnetic free layer, said tuning layer has a thickness that allows an offset field in said magnetic free layer as exerted by said magnetic pinned layer and said magnetic reference layer to be about zero, said magnetic reference layer comprises a first magnetic reference layer formed adjacent to said tunnel junction layer and a second magnetic reference layer separated from said first magnetic reference layer by a coupling layer, said second magnetic reference layer has a different lattice structure from said tunnel junction layer.

33. The STTMRAM element according to claim 32, wherein said second magnetic reference layer has an FCC lattice structure.

34. A spin transfer torque magnetic random access memory (STTMRAM) element comprising:
a magnetic pinned layer having a first fixed magnetization direction substantially perpendicular to a film plane thereof;
a magnetic free layer separated from said magnetic pinned layer by a non-magnetic tuning layer and having a variable magnetization direction substantially perpendicular to a film plane thereof; and
a magnetic reference layer separated from said magnetic free layer by an insulating tunnel junction layer and having a second fixed magnetization direction substantially opposite to said first fixed magnetization direction provided in said magnetic pinned layer,
wherein said magnetic pinned layer and said magnetic reference layer have different magnetic switching fields and are formed on opposite sides of said magnetic free layer, said tuning layer has a thickness that allows an offset field in said magnetic free layer as exerted by said magnetic pinned layer and said magnetic reference layer to be about zero, said magnetic reference layer comprises a first magnetic reference layer formed adjacent to said tunnel junction layer and a second magnetic reference layer separated from said first magnetic reference layer by a coupling layer, said coupling layer comprises an oxide layer formed adjacent to said first magnetic reference layer and a conductive layer formed adjacent to said second magnetic reference layer.

35. The STTMRAM element according to claim 34, wherein said oxide layer is made of MgO and said conductive layer comprises one of Ta, Ti, TaN, TiN, W, Ru, Cu, TiCr, Cr, and Al.

36. The STTMRAM element according to claim 34, wherein said conductive layer comprises a non-magnetic conductive layer formed adjacent to said second magnetic reference layer and a magnetic conductive layer.

37. The STTMRAM element according to claim 34, wherein said tuning layer comprises a MgO layer and a Ta layer with a CoFeB layer interposed therebetween, said MgO layer formed adjacent to said magnetic free layer, said Ta layer formed adjacent to said magnetic pinned layer.

38. A spin transfer torque magnetic random access memory (STTMRAM) element comprising:
a magnetic pinned layer having a first fixed magnetization direction substantially perpendicular to a film plane thereof;
a magnetic free layer separated from said magnetic pinned layer by a non-magnetic tuning layer and having a variable magnetization direction substantially perpendicular to a film plane thereof; and
a magnetic reference layer separated from said magnetic free layer by an insulating tunnel junction layer and having a second fixed magnetization direction substantially opposite to said first fixed magnetization direction provided in said magnetic pinned layer,
wherein said magnetic pinned layer and said magnetic reference layer have different magnetic switching fields and are formed on opposite sides of said magnetic free layer, said tuning layer has a thickness that allows an offset field in said magnetic free layer as exerted by said magnetic pinned layer and said magnetic reference layer to be about zero, said tuning layer comprises an oxide layer formed adjacent to said magnetic free layer and a conductive layer formed adjacent to said magnetic pinned layer.

39. The STTMRAM element according to claim 38, wherein said oxide layer is made of MgO and said conductive layer is made of any of Ta, Ti, TaN, TiN, W, Ru, Cu, TiCr, Cr, Al.

40. The STTMRAM element according to claim 38, wherein said conductive layer is composed of a magnetic layer and a non-magnetic layer with said non-magnetic layer next to said magnetic pinned layer.

41. The STTMRAM element according to claim 40, wherein said tuning layer comprises a MgO layer a CoFeB layer, and a Ta layer, said CoFeB layer is formed between said Ta layer and said MgO layer, said MgO layer is formed adjacent to said magnetic free layer, said Ta layer is formed adjacent to said magnetic pinned layer.

42. A spin transfer torque magnetic random access memory (STTMRAM) element comprising:
a magnetic pinned layer having a first fixed magnetization direction substantially perpendicular to a film plane thereof;
a magnetic free layer separated from said magnetic pinned layer by a tuning layer and having a variable magnetization direction substantially perpendicular to a film plane thereof; and
a magnetic reference layer separated from said magnetic free layer by an insulating tunnel junction layer and having a second fixed magnetization direction substantially opposite to said first fixed magnetization direction provided in said magnetic pinned layer,
wherein said magnetic reference layer comprises a first magnetic reference layer formed adjacent to said tunnel junction layer and a second magnetic reference layer separated from said first magnetic reference layer by a coupling layer, said coupling layer is made of Ta, Ti, TaN, TiN, W, or any combination thereof.

43. The STTMRAM element according to claim 42, wherein said magnetic pinned layer is formed of a material comprising at least one of Co, Fe, and Ni, and at least one of Pt, Cr, and Pd.

44. The STTMRAM element according to claim 42, wherein said magnetic pinned layer has a structure formed by repeated interlacing of base pair layers, one of said base pair layers comprises at least one of Co and Fe and the other one of said base pair layers comprises at least one of Pd, Pt, and Ni.

45. The STTMRAM element according to claim 42, wherein said magnetic pinned layer has a structure formed by repeated interlacing of base pair layers of Co/Pt, Co/Pd, Co/Ni, CoFe/Pt, CoFe/Pd, CoFe/Ni, or any combination thereof.

46. The STTMRAM element according to claim 42, wherein said magnetic free layer comprises a CoFeB alloy.

47. The STTMRAM element according to claim 42, wherein said magnetic free layer includes an interface layer formed adjacent to said tuning layer, said interface layer comprises a magnetic material selected from the group consisting of CoFe, Fe, and CoFeB.

48. The STTMRAM element according to claim 42, wherein said magnetic free layer includes an interface layer formed adjacent to said tunnel junction layer, said interface layer comprises a magnetic material selected from the group consisting of CoFe, Fe, and CoFeB.

49. The STTMRAM element according to claim 42, wherein said magnetic free layer comprises a first and second magnetic free sublayers with an insertion layer interposed therebetween.

50. The STTMRAM element according to claim 49, wherein each of said first and second magnetic free sublayers comprises a CoFeB alloy.

51. The STTMRAM element according to claim 49, wherein said insertion layer comprises a material selected from the group consisting of Ta, CoFeTa, CoFeBTa, Hf, CoFeHf, CoFeBHf, Zr, CoFeZr, CoFeBZr, V, CoFeV, CoFeBV, and any combination thereof.

52. The STTMRAM element according to claim 42, wherein said first magnetic reference layer comprises a CoFeB alloy.

53. The STTMRAM element according to claim 42, wherein said first magnetic reference layer includes an interface layer formed adjacent to said tunnel junction layer, said interface layer comprises a magnetic material selected from the group consisting of CoFe, Fe, and CoFeB.

54. The STTMRAM element according to claim 42, wherein said first magnetic reference layer includes an interface layer formed adjacent to said coupling layer, said interface layer comprises a magnetic material selected from the group consisting of CoFe, Fe, and CoFeB.

55. The STTMRAM element according to claim 42, wherein said second magnetic reference layer is formed of a material comprising at least one of Co, Fe, and Ni, and at least one of Pt, Cr, and Pd.

56. The STTMRAM element according to claim 42, wherein said second magnetic reference layer has a structure formed by repeated interlacing of base pair layers, one of said base pair layers comprises at least one of Co and Fe and the other one of said base pair layers comprises at least one of Pd, Pt, and Ni.

57. The STTMRAM element according to claim 42, wherein said second magnetic reference layer has a structure formed by repeated interlacing of base pair layers of Co/Pt, Co/Pd, Co/Ni, CoFe/Pt, CoFe/Pd, CoFe/Ni, or any combination thereof.

58. The STTMRAM element according to claim 42, wherein said tuning layer comprises a non-magnetic conductive material.

59. The STTMRAM element according to claim 58, wherein said non-magnetic conductive material is made of Ta, Ti, TaN, TiN, W, or any combination thereof.

60. The STTMRAM element according to claim 42, wherein said tuning layer comprises an insulating layer formed adjacent to said magnetic free layer and a first conductive layer formed adjacent to said insulating layer.

61. The STTMRAM element according to claim 60, wherein said insulating layer is made of MgO and said first conductive layer is made of Ta, Ti, TaN, TiN, W, CoFeB, Ru, Cu, TiCr, Cr, or Al.

62. The STTMRAM element according to claim 60, wherein said tuning layer further comprises a second conductive layer formed adjacent to said first conductive layer and a non-magnetic seed layer formed adjacent to said magnetic pinned layer.

63. The STTMRAM element according to claim 62, wherein said insulating layer is made of MgO, said first conductive layer is made of CoFeB, said second conductive layer is made of Ta, said non-magnetic seed layer is made of Ru.

* * * * *